United States Patent
Kakita et al.

(10) Patent No.: US 8,859,894 B2
(45) Date of Patent: Oct. 14, 2014

(54) BINUCLEAR RUTHENIUM COMPLEX DYE, RUTHENIUM-OSMIUM COMPLEX DYE, PHOTOELECTRIC CONVERSION ELEMENT USING ANY ONE OF THE COMPLEX DYES, AND PHOTOCHEMICAL CELL

(75) Inventors: Kazuaki Kakita, Chiba (JP); Shusaku Wada, Chiba (JP); Takafumi Iwasa, Chiba (JP); Yoshihisa Kakuta, Tokyo (JP)

(73) Assignee: UBE Industries, Ltd., Yamaguchi (JP)

( * ) Notice: Subject to any disclaimer, the term of this patent is extended or adjusted under 35 U.S.C. 154(b) by 675 days.

(21) Appl. No.: 13/000,313

(22) PCT Filed: Jun. 19, 2009

(86) PCT No.: PCT/JP2009/061223
§ 371 (c)(1),
(2), (4) Date: Dec. 20, 2010

(87) PCT Pub. No.: WO2009/154275
PCT Pub. Date: Dec. 23, 2009

(65) Prior Publication Data
US 2011/0100467 A1    May 5, 2011

(30) Foreign Application Priority Data

Jun. 19, 2008  (JP) .................. 2008-160171
Dec. 25, 2008  (JP) .................. 2008-329077
Feb. 4, 2009   (JP) .................. 2009-024115
Mar. 4, 2009   (JP) .................. 2009-050942

(51) Int. Cl.
*H01L 51/00*   (2006.01)
*H01M 14/00*   (2006.01)
*H01G 9/20*    (2006.01)
*C09B 57/10*   (2006.01)

(52) U.S. Cl.
CPC ............ *C09B 57/10* (2013.01); *H01L 51/0088* (2013.01); *H01M 14/005* (2013.01); *Y02E 10/542* (2013.01); *H01L 51/0086* (2013.01); *H01G 9/2059* (2013.01)
USPC .......................................................... 136/263

(58) Field of Classification Search
CPC .................. H01L 33/02008; H01L 33/02021; H01L 33/0264; H01L 33/032; H01L 33/04; H01L 27/301; H01L 51/0032
USPC .......................... 136/206, 220, 224, 252, 263
See application file for complete search history.

(56) References Cited

U.S. PATENT DOCUMENTS

| | | | |
|---|---|---|---|
| 4,927,721 A | 5/1990 | Gratzel et al. | |
| 5,084,365 A | 1/1992 | Gratzel et al. | |
| 2006/0237059 A1 | 10/2006 | Kurihara et al. | |
| 2008/0015356 A1 | 1/2008 | Kakuta et al. | |
| 2010/0006805 A1 | 1/2010 | Iwasa et al. | |
| 2012/0204959 A1* | 8/2012 | Kakita et al. ................... | 136/263 |

FOREIGN PATENT DOCUMENTS

| | | |
|---|---|---|
| JP | 1989-220380 A | 9/1989 |
| JP | 2003-261536 A | 9/2003 |
| JP | 2004-359677 A | 12/2004 |
| JP | A-2007-277513 | 10/2007 |
| WO | WO 2006/038587 A1 | 4/2006 |
| WO | WO 2008/093742 | 8/2008 |

OTHER PUBLICATIONS

Rau, et al., "A Bibenzimidazole-Containing Ruthenium (II) Complex Acting as a Cation-Driven Molecular Switch," *Inorganic Chemistry*, (Apr. 3, 2000), 39(7):1621-1624.

O'Regan, et al., "A Low-Cost, High-Efficiency Solar Cell Based on Dye-Sensitized Colloidal $TiO_2$ Films," (1991) *Nature* 353:737-739.

International Preliminary Report on Patentability and Written Opinion in corresponding PCT Application No. PCT/JP2009/061223, mailed Feb. 17, 2011.

—●— $R^{01}$ = H;
Binuclear Ruthenium Complex Dye (A-2)
—■— $R^{01}$ = t-butyl;
Binuclear Ruthenium Complex Dye (A-1a)
—▲— $R^{01}$ = n-nonyl;
Binuclear Ruthenium Complex Dye (A-1b)

Rau, et al., "Bis(R-bipyridyl)ruthenium bibenzimidazole complexes (R=H, Me or tBu):Supramolecular Arrangement Via Hydrogen Bonds, Photo- and Electro-chemical Properties and Reactivity Towards Carbon Dioxide," *J. Chem. Soc., Dalton Trans.*, (Oct. 21, 2000) p. 3649-3657.

International Search Report issued in corresponding PCT Application No. PCT/JP2009/061223, mailed Aug. 25, 2009.

Extended European Search Report issued in corresponding European Patent Application No. 09766723.2 on May 7, 2012.

* cited by examiner

*Primary Examiner* — Susan D Leong

(74) *Attorney, Agent, or Firm* — Knobbe Martens Olson & Bear, LLP

(57) ABSTRACT

The present invention relates to a binuclear ruthenium complex dye represented by the following general formula (1-1):

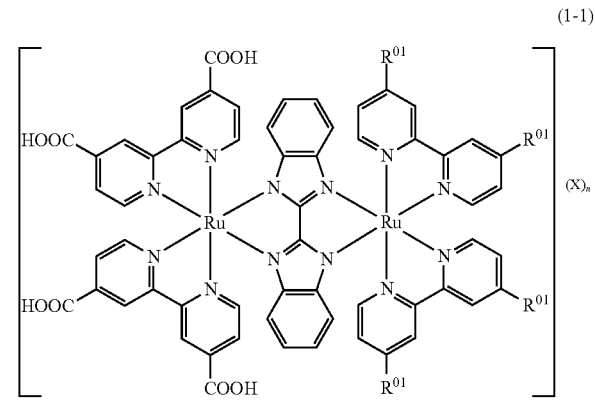

(1-1)

wherein $R^{01}$ represents a linear or branched alkyl group having 2 to 18 carbon atoms; X represents a counter ion; and n represents a number of the counter ions needed to neutralize a charge of the complex; and in which proton(s) ($H^+$) of one or more carboxyl groups (—COOH) may dissociate.

6 Claims, 4 Drawing Sheets

- ○ $R^{01}$ = H ;
  Binuclear Ruthenium Complex Dye (A-2)
- ■ $R^{01}$ = t-butyl;
  Binuclear Ruthenium Complex Dye (A-1a)
- ▲ $R^{01}$ = n-nonyl;
  Binuclear Ruthenium Complex Dye (A-1b)

—— R$^{04}$ = methyl; Ruthenium-Osmium Complex Dye (D-1)
---- R$^{04}$ = H; Ruthenium-Osmium Complex Dye (D-2)

BINUCLEAR RUTHENIUM COMPLEX DYE, RUTHENIUM-OSMIUM COMPLEX DYE, PHOTOELECTRIC CONVERSION ELEMENT USING ANY ONE OF THE COMPLEX DYES, AND PHOTOCHEMICAL CELL

This application is the U.S. National Phase under 35 U.S.C. §371 of International Application No. PCT/JP2009/061223, filed Jun. 19, 2009, designating the U.S., and published in Japanese as WO2009/154275 on Dec. 23, 2009, which claims priority to Japanese Patent Application No. 2008-160171, filed Jun. 19, 2008; Japanese Patent Application No. 2008-329077, filed Dec. 25, 2008; Japanese Patent Application No. 2009-024115, filed Feb. 4, 2009; and Japanese Patent Application No. 2009-050942, filed Mar. 4, 2009, the entire contents of which are incorporated herein by reference.

TECHNICAL FIELD

The present invention relates to a binuclear ruthenium complex dye, and a ruthenium-osmium complex dye. The present invention also relates to a photoelectric conversion element comprising any one of these complex dyes, and a photochemical cell comprising the photoelectric conversion element.

BACKGROUND ART

A solar battery is greatly expected to serve as a clean renewable energy source, and researches have been conducted for practical application of a monocrystalline-silicon, polycrystalline-silicon or amorphous-silicon-based solar battery and a solar battery containing a compound such as cadmium telluride and indium copper selenide. For the spread of solar battery as a household power source, however, any of these batteries faces many problems to be overcome, including a higher production cost, difficulty in ensuring raw materials, difficulty in recycling, and difficulty in realizing a larger area. Accordingly, there have been proposed solar batteries using an organic material in an attempt to achieve a larger area and a lower cost. However, any of these batteries has a conversion efficiency of about 1%, which falls very short of practical use.

Under such circumstances, Graetzel et al. disclosed a photoelectric conversion element and a solar battery using semiconductor particles sensitized by a dye, as well as materials and production technique needed to produce this solar battery in 1991 (see, for example, Non-patent document 1 and Patent document 1). This battery is a wet solar battery comprising a porous titania thin film sensitized by a ruthenium dye as a working electrode. This solar battery has the advantages that the photoelectric conversion element can be provided at a low cost because inexpensive materials can be used without highly purification, and that the solar battery can convert solar light into electricity over a wide visible light wavelength range because a dye having broad absorption band is used. However, the conversion efficiency must be further improved for practical use. Thus, there is a need for a dye which has a higher absorption coefficient and absorb light of longer wavelength.

Patent document 2 discloses a mononuclear metal complex containing a dipyridyl ligand, which is a metal complex dye useful for a photoelectric conversion element. In addition, Non-patent document 2 discloses a polynuclear β-diketonate complex dye.

Meanwhile, Patent document 3 discloses a polynuclear complex containing a plurality of metals and a plurality of ligands wherein a bridging ligand (BL) coordinating to the plurality of metals has both a coordination structure with a conjugated heterocyclic ring and a coordination structure without a conjugated heterocyclic ring, which is regarded as a novel polynuclear complex having the excellent photoelectric conversion function of emitting electrons while receiving energy from active ray such as light.

Patent document 4 discloses a binuclear metal complex having a coordination structure with a conjugated heterocyclic ring, which is a metal complex dye for realizing a photoelectric conversion element having higher photoelectric conversion efficiency.

In the case of a ruthenium-osmium complex dye, in particular, its ability to absorb light in the longer wavelength region must be further improved for practical use. However, in a ruthenium-osmium complex dye which absorb light of longer wavelength, the HOMO-LUMO of the dye is apt to mismatch the energy level of $TiO_2$ (CB) or iodine redox, commonly-used peripheral members [semiconductor particle and electrolyte (redox couple)], and therefore electron transfer may not effectively occur. Thus, there is a need for a ruthenium-osmium complex dye, which is capable of absorbing light of longer wavelength and has an energy level matched with a peripheral member.

CITATION LIST

Patent Document

Patent document 1: JP-A-1989-220380
Patent document 2: JP-A-2003-261536
Patent document 3: JP-A-2004-359677
Patent document 4: WO 2006/038587 A1

Non-Patent Document

Non-patent document 1: Nature, Vol. 353, p. 737, 1991
Non-patent document 2: "Current Technology in Dye-sensitized Solar Battery" (CMC Co., LTD., published on May 25, 2001, p. 117)

SUMMARY OF INVENTION

Problems to be Solved by the Invention

The first objective of the present invention is to provide a binuclear ruthenium complex dye for realizing a photoelectric conversion element and a photochemical cell which may be produced by adsorbing the binuclear ruthenium complex dye to a semiconductor particle in a shorter period of time, and exhibit high photoelectric conversion efficiency.

The second objective of the present invention is to provide a binuclear ruthenium complex dye capable of absorbing light of longer wavelength for realizing a photoelectric conversion element and a photochemical cell which may convert solar light into electricity over a wide wavelength range, and exhibit high photoelectric conversion efficiency.

The third objective of the present invention is to provide a binuclear ruthenium complex dye containing 1,10-phenanthroline having a hydrophobic substituent as a ligand; particularly a binuclear ruthenium complex dye for realizing a photoelectric conversion element and a photochemical cell which may exhibit high photoelectric conversion efficiency on a per-ruthenium-complex-dye basis even when using an aqueous liquid electrolyte.

The fourth objective of the present invention is to provide a ruthenium-osmium complex dye, which is capable of absorbing light of longer wavelength and has HOMO-LUMO energy level matching the energy levels of $TiO_2$ (CB) and iodine redox ($I^-/I_3^-$).

Means for Solving the Problems

The present invention relates to the following items.

1. A binuclear ruthenium complex dye represented by the following general formula (1-1):

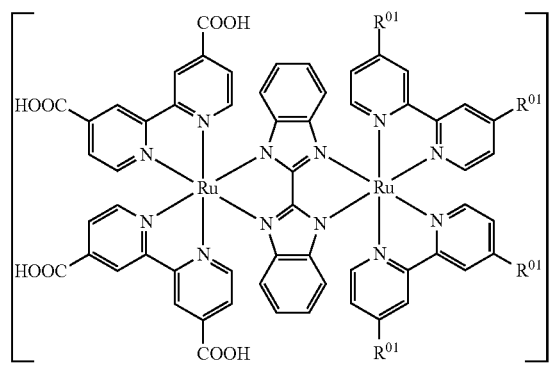

(1-1)

wherein $R^{01}$ represents a linear or branched alkyl group having 2 to 18 carbon atoms; X represents a counter ion; and n represents a number of the counter ions needed to neutralize a charge of the complex; and in which proton(s) ($H^+$) of one or more carboxyl groups (—COOH) may dissociate.

2. A binuclear ruthenium complex dye represented by the following general formula (2-1):

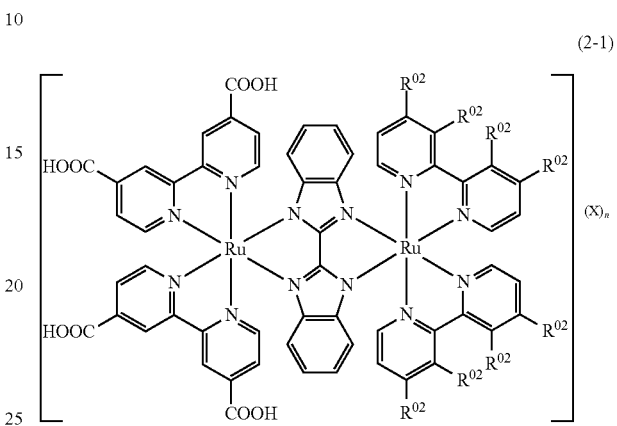

(2-1)

wherein $R^{02}$ represents a linear or branched alkyl group having 2 to 18 carbon atoms, or two $R^{02}$s present on a pyridine ring form an aromatic hydrocarbon ring or an aliphatic hydrocarbon ring together with the carbon atoms to which they are bound; X represents a counter ion; and n represents a number of the counter ions needed to neutralize a charge of the complex; and in which proton(s) ($H^+$) of one or more carboxyl groups (—COOH) may dissociate.

3. A binuclear ruthenium complex dye represented by the following general formula (3-1):

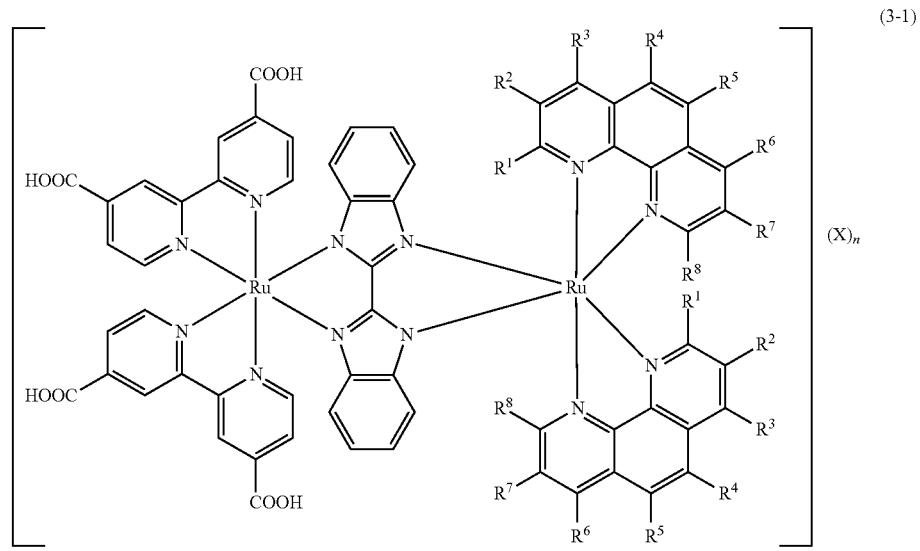

(3-1)

wherein $R^1$, $R^2$, $R^3$, $R^4$, $R^5$, $R^6$, $R^7$ and $R^8$ each independently represents a hydrogen atom or a hydrophobic substituent; X represents a counter ion; and n represents a number of the counter ions needed to neutralize a charge of the complex; with the proviso that the binuclear ruthenium complex dye in which $R^1$, $R^2$, $R^3$, $R^4$, $R^5$, $R^6$, $R^7$ and $R^8$ are all hydrogen atoms is excluded; and in which proton(s) ($H^+$) of one or more carboxyl groups (—COOH) may dissociate.

4. A binuclear ruthenium complex dye as described in the above item 3, wherein the hydrophobic substituent is an alkyl group, an aralkyl group or an aryl group.

5. A ruthenium-osmium complex dye represented by the following general formula (4-1):

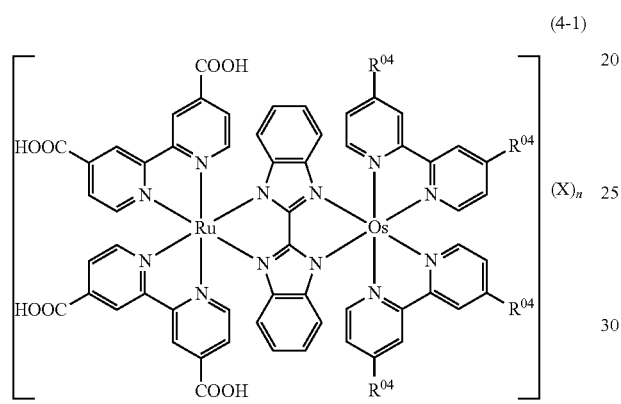

(4-1)

wherein $R^{04}$ represents a linear or branched alkyl group having 1 to 18 carbon atoms, a linear or branched alkoxy group having 1 to 18 carbon atoms, an aralkyl group having 6 to 15 carbon atoms, an aryl group having 6 to 15 carbon atoms, an aralkyloxy group having 6 to 15 carbon atoms, or an aryloxy group having 6 to 15 carbon atoms; X represents a counter ion; and n represents a number of the counter ions needed to neutralize a charge of the complex; and in which proton(s) ($H^+$) of one or more carboxyl groups (—COOH) may dissociate.

6. A photoelectric conversion element comprising a binuclear ruthenium complex dye as described in any one of the above items 1 to 4 or a ruthenium-osmium complex dye as described in the above item 5; and a semiconductor particle.

7. A photoelectric conversion element as described in the above item 6, wherein the semiconductor particle is at least one selected from the group consisting of titanium oxide, zinc oxide and tin oxide.

8. A photochemical cell comprising a photoelectric conversion element as described in any one of the above items 6 to 7.

9. A photochemical cell comprising a photoelectric conversion element as described in any one of the above items 6 to 7 as an electrode, a counter electrode, and an electrolyte layer between them.

10. A process for producing a photoelectric conversion element, comprising a step of:
    immersing a semiconductor particle in a solution containing a binuclear ruthenium complex dye as described in any one of the above items 1 to 4 or a ruthenium-osmium complex dye as described in the above item 5.

11. A process for producing a photoelectric conversion element, comprising steps of:
    forming a semiconductor layer comprising a semiconductor particle on a conductive support; and
    immersing the semiconductor layer in a solution containing a binuclear ruthenium complex dye as described in any one of the above items 1 to 4 or a ruthenium-osmium complex dye as described in the above item 5.

12. A mononuclear ruthenium complex precursor represented by the following general formula (1-2):

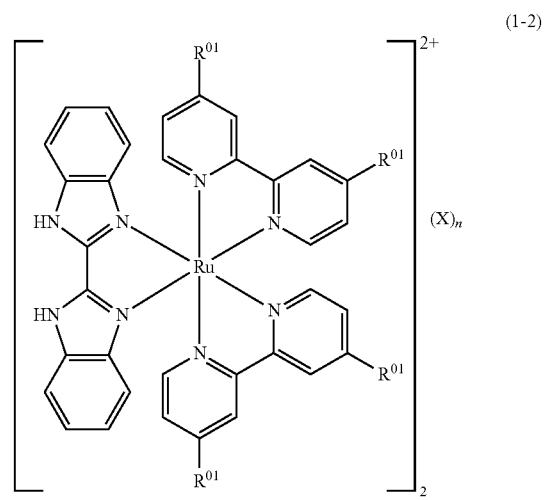

(1-2)

wherein $R^{01}$, X and n are defined as above.

13. A mononuclear ruthenium complex represented by the following general formula (1-3):

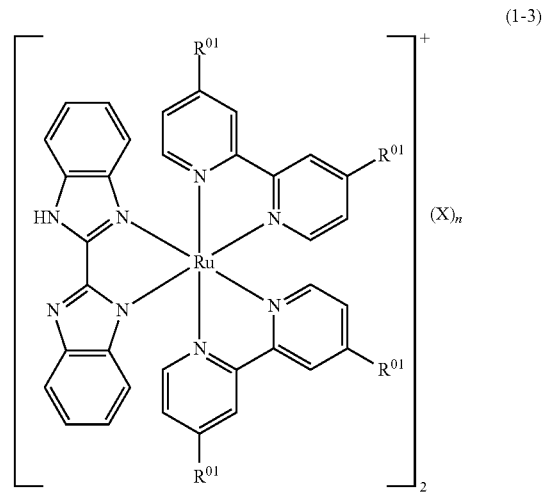

(1-3)

wherein $R^{01}$, X and n are defined as above.

14. A mononuclear ruthenium complex precursor represented by the following general formula (2-2):

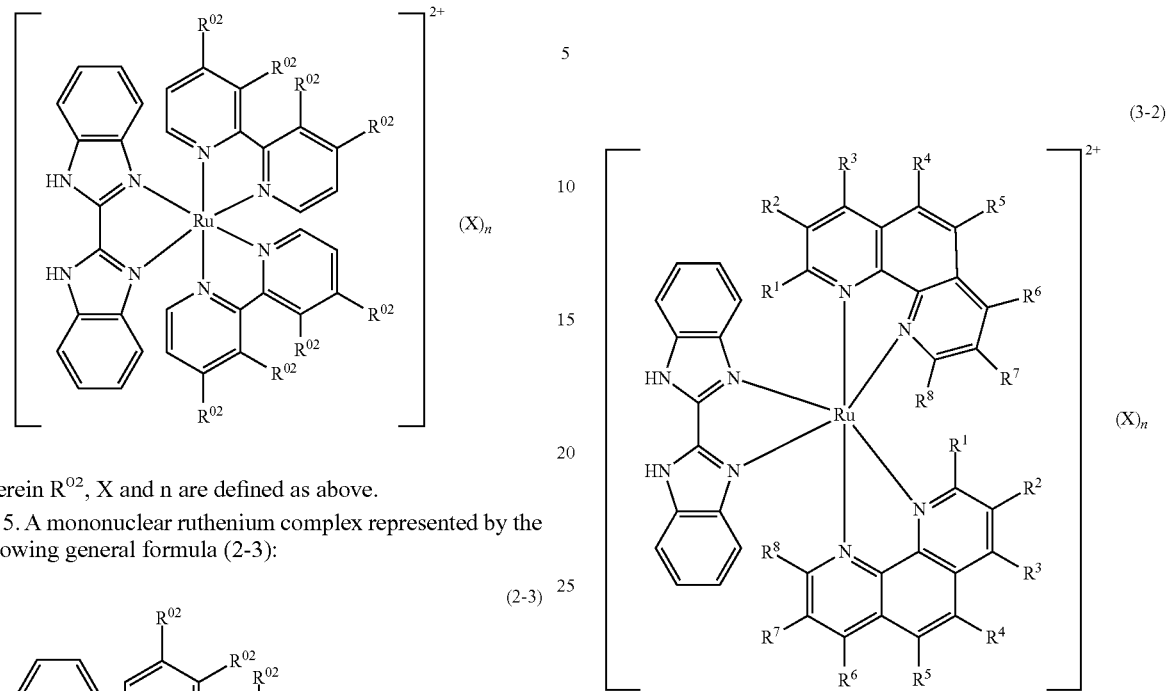

(2-2)

wherein $R^{02}$, X and n are defined as above.

15. A mononuclear ruthenium complex represented by the following general formula (2-3):

(2-3)

wherein $R^{02}$ is defined as above.

16. A mononuclear ruthenium complex represented by the following general formula (2-4):

(2-4)

wherein $R^{02}$, X and n are defined as above.

17. A mononuclear ruthenium complex precursor represented by the following general formula (3-2):

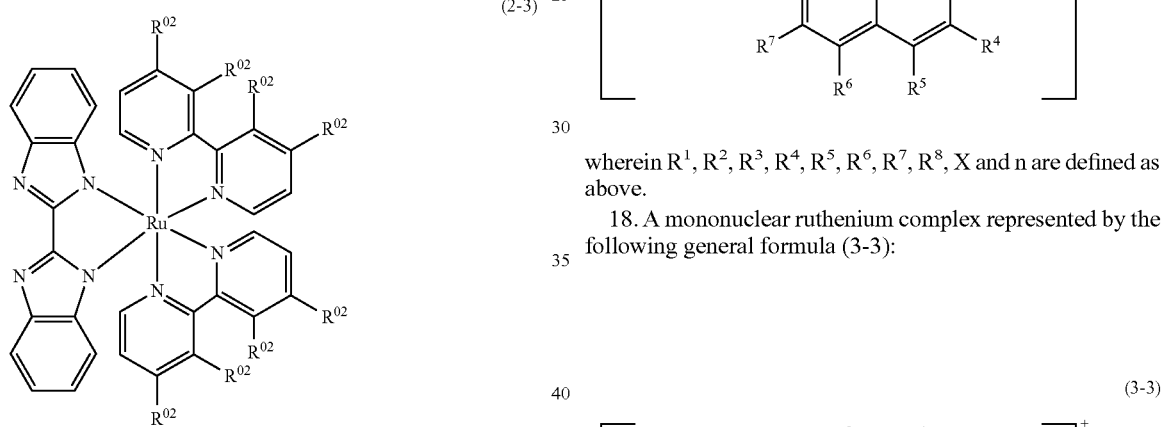

(3-2)

wherein $R^1$, $R^2$, $R^3$, $R^4$, $R^5$, $R^6$, $R^7$, $R^8$, X and n are defined as above.

18. A mononuclear ruthenium complex represented by the following general formula (3-3):

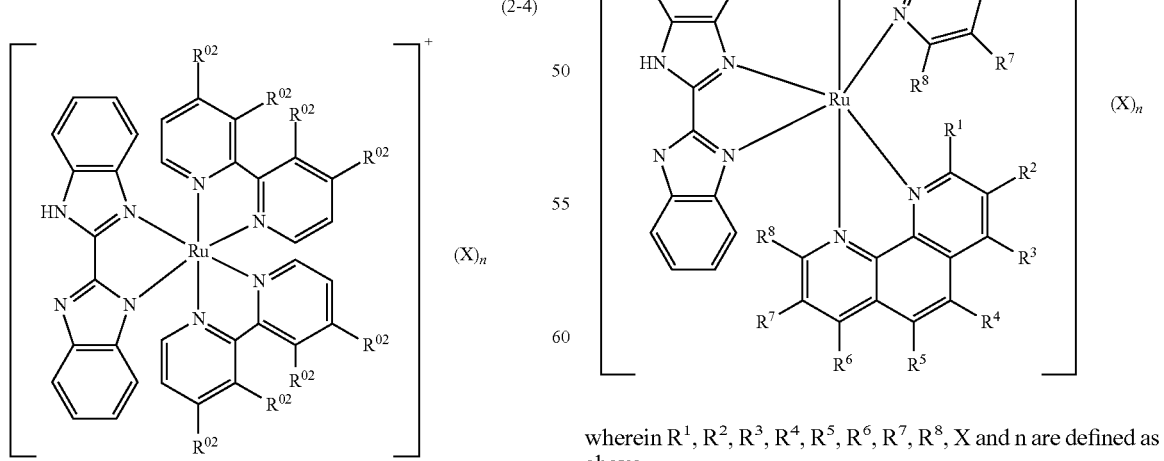

(3-3)

wherein $R^1$, $R^2$, $R^3$, $R^4$, $R^5$, $R^6$, $R^7$, $R^8$, X and n are defined as above.

19. A mononuclear ruthenium complex represented by the following general formula (3-4):

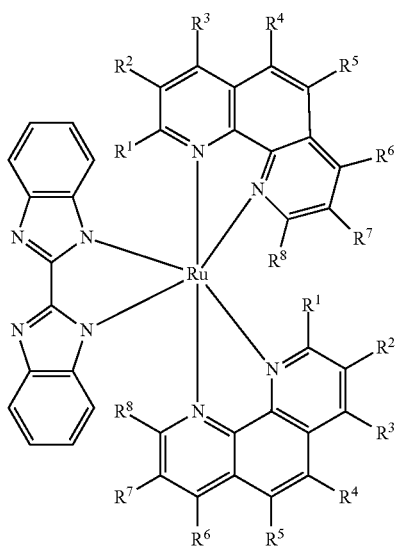

(3-4)

wherein $R^1$, $R^2$, $R^3$, $R^4$, $R^5$, $R^6$, $R^7$ and $R^8$ are defined as above.

20. A mononuclear osmium complex precursor represented by the following general formula (4-2):

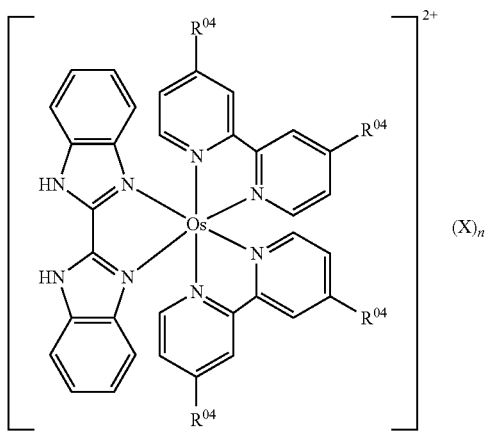

(4-2)

wherein $R^{04}$, X and n are defined as above.

21. A mononuclear osmium complex represented by the following general formula (4-3):

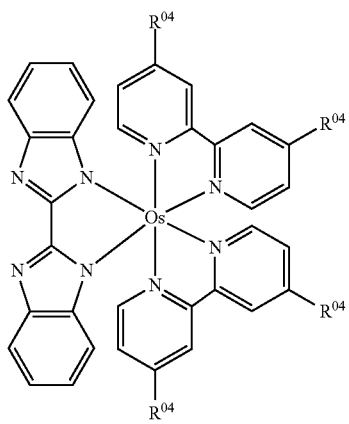

(4-3)

wherein $R^{04}$ is defined as above.

22. A mononuclear osmium complex represented by the following general formula (4-4):

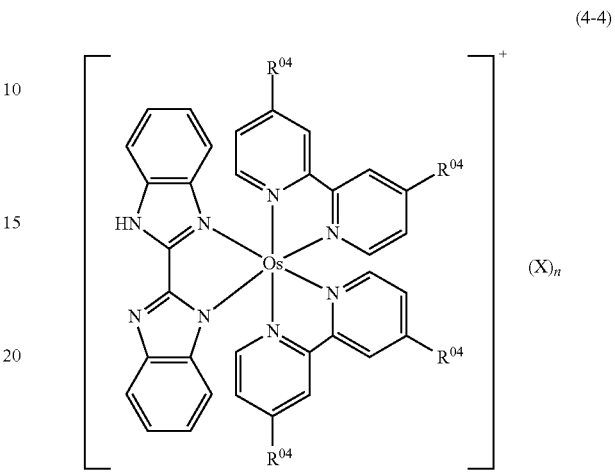

(4-4)

wherein $R^{04}$, X and n are defined as above.

Effect of the Invention

The first metal complex dye of the present invention (also referred to as "binuclear metal complex dye (A)") is a binuclear ruthenium complex dye represented by the general formula (1-1) as described above, which contains a substituted bipyridyl group. When using the binuclear metal complex dye (A), a photoelectric conversion element and a photochemical cell which exhibit high photoelectric conversion efficiency may be produced by adsorbing the binuclear ruthenium complex dye to a semiconductor particle in a shorter period of time, as compared with a binuclear ruthenium complex dye which contains a bipyridine having no substituent as a ligand.

The second metal complex dye of the present invention (also referred to as "binuclear metal complex dye (B)") is a binuclear ruthenium complex dye represented by the general formula (2-1) as described above, which contains a substituted bipyridyl group. The binuclear metal complex dye (B) is capable of absorbing light of longer wavelength, as compared with a binuclear ruthenium complex dye which contains a bipyridine having no substituent as a ligand. Accordingly, it is expected that a photoelectric conversion element and a photochemical cell which convert solar light into electricity over a wide wavelength range, and exhibit higher photoelectric conversion efficiency may be produced using the binuclear metal complex dye (B).

The third metal complex dye of the present invention (also referred to as "binuclear metal complex dye (C)") is a binuclear ruthenium complex dye represented by the general formula (3-1) as described above, which contains 1,10-phenanthroline having a hydrophobic substituent as a ligand.

The binuclear metal complex dye (C) contains 1,10-phenanthroline having a hydrophobic substituent as a ligand. Accordingly, a photoelectric conversion element and a photochemical cell which exhibit higher photoelectric conversion efficiency on a per-ruthenium-complex-dye basis may be produced when using the binuclear metal complex dye (C), as compared with a binuclear ruthenium complex dye having no hydrophobic substituent.

The term "phenanthroline" as used herein means 1,10-phenanthroline.

The fourth metal complex dye of the present invention (also referred to as "binuclear metal complex dye (D)") is a ruthenium-osmium complex dye represented by the general formula (4-1) as described above, which contains a substituted bipyridyl group. The binuclear metal complex dye (D) has the nearly equal ability to absorb light of longer wavelength and has HOMO-LUMO energy level well matching the energy levels of $TiO_2$ (CB) and iodine redox ($I^-/I_3^-$), as compared with a ruthenium-osmium complex dye which contains a bipyridine having no substituent as a ligand. Accordingly, it is expected that a dye-sensitized solar cell which exhibit higher photoelectric conversion efficiency may be produced using the binuclear metal complex dye (D).

DESCRIPTION OF EMBODIMENTS

Figure 1:
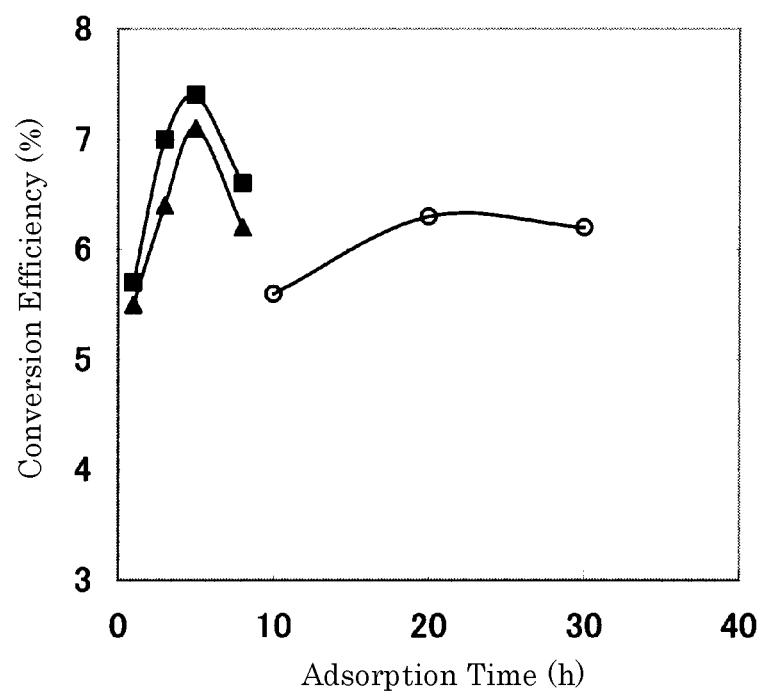
FIG. 1 is a graph showing the change in the conversion efficiency of the binuclear ruthenium complex dye (A-1a), the binuclear ruthenium complex dye (A-1b) and a known binuclear ruthenium complex dye (A-2) with respect to dye adsorption time.

The First Metal Complex Dye of the Present Invention (Binuclear Metal Complex Dye (A))

The first metal complex dye of the present invention (binuclear metal complex dye (A)) is represented by the general formula (1-1) as described above. In the general formula (1-1), $R^{01}$ represents a linear or branched alkyl group having 2 to 18 carbon atoms. $R^{01}$ may be, for example, ethyl group, propyl group, butyl group, pentyl group, hexyl group, heptyl group, octyl group, nonyl group, decyl group, undecyl group, dodecyl group, tridecyl group, tetradecyl group, pentadecyl group, hexadecyl group, heptadecyl group, or octadecyl group. $R^{01}$ may be preferably an alkyl group having 4 to 9 carbon atoms such as butyl group, pentyl group, hexyl group, heptyl group, octyl group, and nonyl group. $R^{01}$ may be more preferably t-butyl group or n-nonyl group. These groups include various isomers.

X represents a counter ion. X may be, for example, hexafluorophosphate ion, perchlorate ion, tetraphenylborate ion, tetrafluoroborate ion, trifluoromethanesulfonate ion, thiocyanate ion, sulfate ion, nitrate ion, or halide ion. X may be preferably hexafluorophosphate ion, tetrafluoroborate ion, trifluoromethanesulfonate ion, nitrate ion or halide ion. X may be more preferably hexafluorophosphate ion, tetrafluoroborate ion, nitrate ion or iodide ion. In addition, n represents a number of the counter ions needed to neutralize a charge of the complex.

The binuclear metal complex dye (A) may be prepared by reacting two different mononuclear ruthenium complexes as shown in the following formula, for example, by reference to WO2006/038587 and the like.

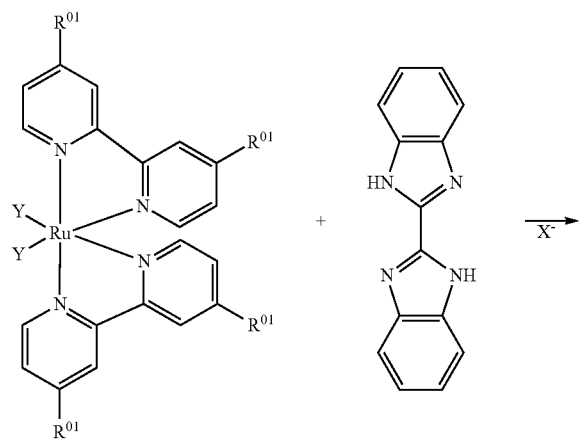

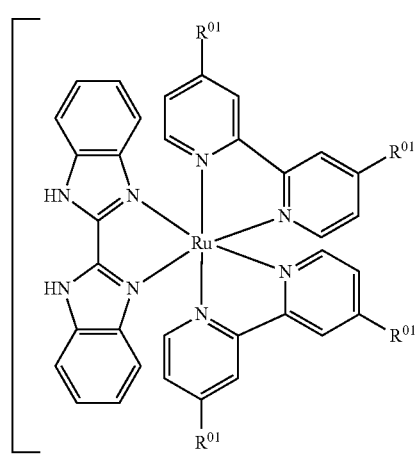

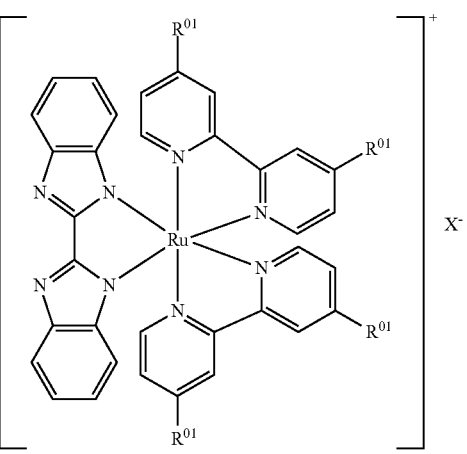

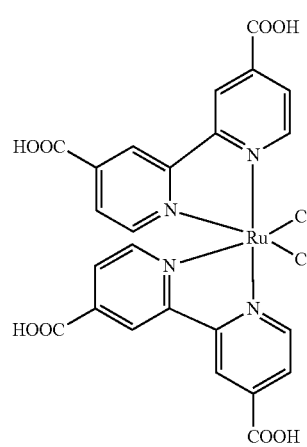

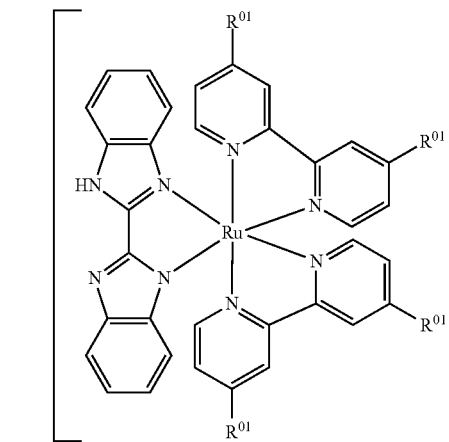

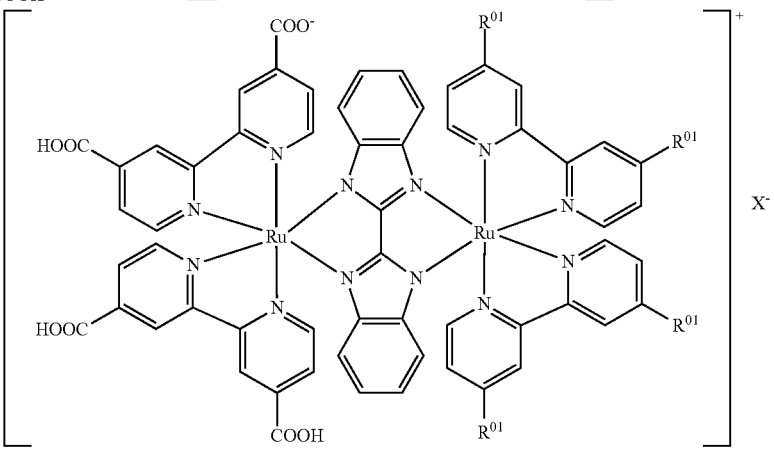

wherein $R^{01}$ is defined as above, $X^-$ represents a monovalent anion being a counter ion, and Y represents a halogen atom.

The counter ion (X) is not limited to a monovalent anion, and other complex dyes may be synthesized in the same way as described above.

One of the mononuclear ruthenium complexes may be synthesized via a mononuclear ruthenium complex precursor. The synthetic intermediate, i.e. the mononuclear ruthenium complex precursor represented by the general formula (1-2) as described above, and the mononuclear ruthenium complex represented by the general formula (1-3) as described above are novel compounds.

In the binuclear metal complex dye (A), proton(s) ($H^+$) of one or more carboxyl groups (—COOH) may dissociate. The dissociation of proton ($H^+$) may be achieved mainly by adjusting the pH of the metal complex dye solution.

The Second Metal Complex Dye of the Present Invention (Binuclear Metal Complex Dye (B))

The second metal complex dye of the present invention (binuclear metal complex dye (B)) is represented by the general formula (2-1) as described above. In the general formula (2-1), $R^{02}$ represents a linear or branched alkyl group having 2 to 18 carbon atoms, or two $R^{02}$s present on a pyridine ring form an aromatic hydrocarbon ring or an aliphatic hydrocarbon ring together with the carbon atoms to which they are bound. $R^{02}$ may be, for example, ethyl group, propyl group, butyl group, pentyl group, hexyl group, heptyl group, octyl group, nonyl group, decyl group, undecyl group, dodecyl group, tridecyl group, tetradecyl group, pentadecyl group, hexadecyl group, heptadecyl group, or octadecyl group. In cases where two $R^{02}$s form a ring, the ring may be, for example, an unconjugated ring such as cyclohexane ring, or a conjugated ring such as benzene ring, and may be preferably a conjugated ring, more preferably benzene ring. It is preferred that two $R^{02}$s present on a pyridine ring form an aromatic hydrocarbon ring, particularly preferably benzene ring, together with the carbon atoms to which they are bound. These groups include various isomers. The ring which two $R^{02}$s form may be substituted.

X represents a counter ion. X may be, for example, hexafluorophosphate ion, perchlorate ion, tetraphenylborate ion, tetrafluoroborate ion, trifluoromethanesulfonate ion, thiocyanate ion, sulfate ion, nitrate ion, or halide ion. X may be preferably hexafluorophosphate ion, tetrafluoroborate ion, trifluoromethanesulfonate ion, nitrate ion or halide ion. X may be more preferably hexafluorophosphate ion, tetrafluoroborate ion, nitrate ion or iodide ion. In addition, n represents a number of the counter ions needed to neutralize a charge of the complex.

The binuclear metal complex dye (B) may be prepared by reacting two different mononuclear ruthenium complexes as shown in the following formula, for example, by reference to WO2006/038587 and the like (hereinafter, referred to as "synthesis method (2-A)").

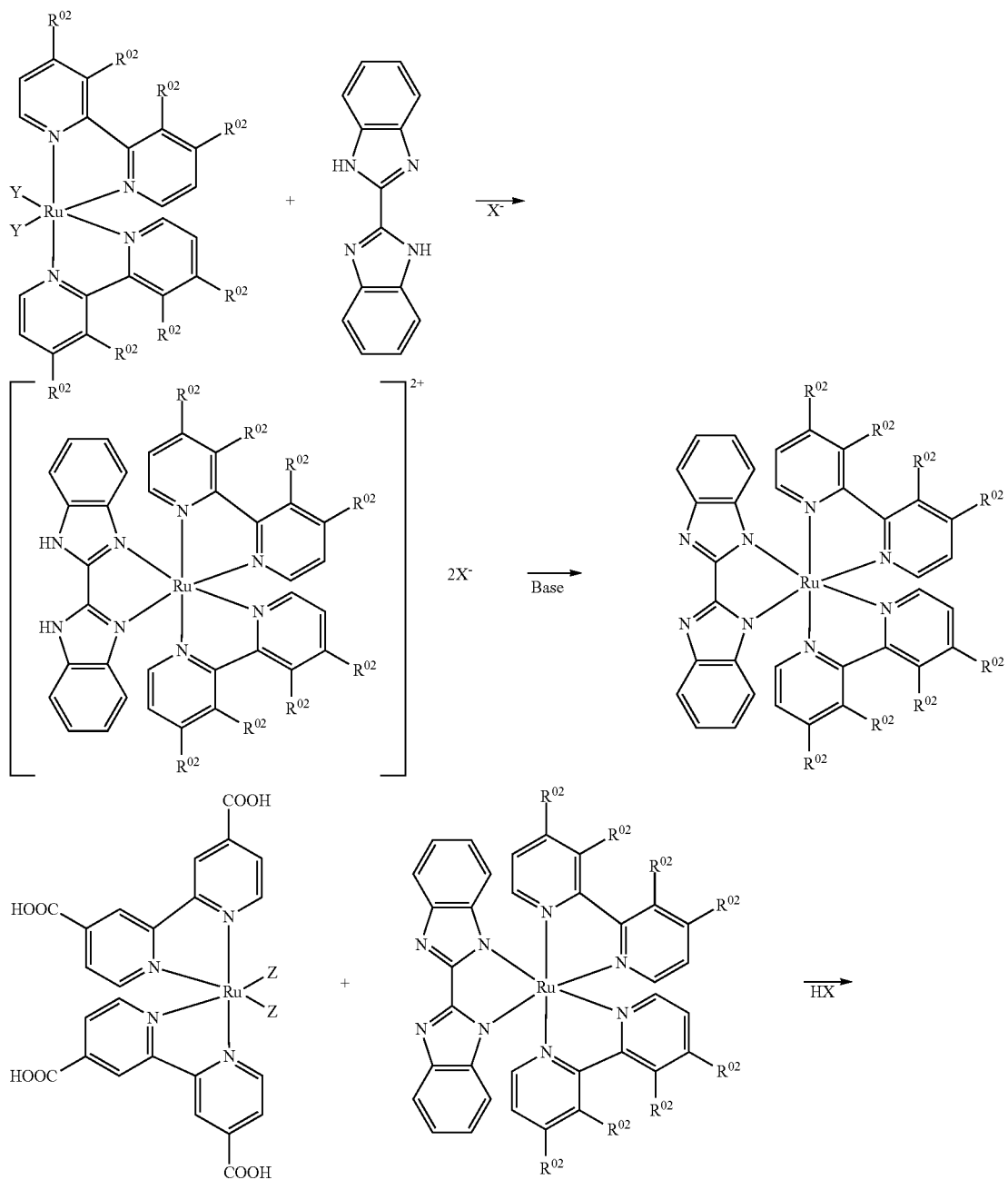

-continued
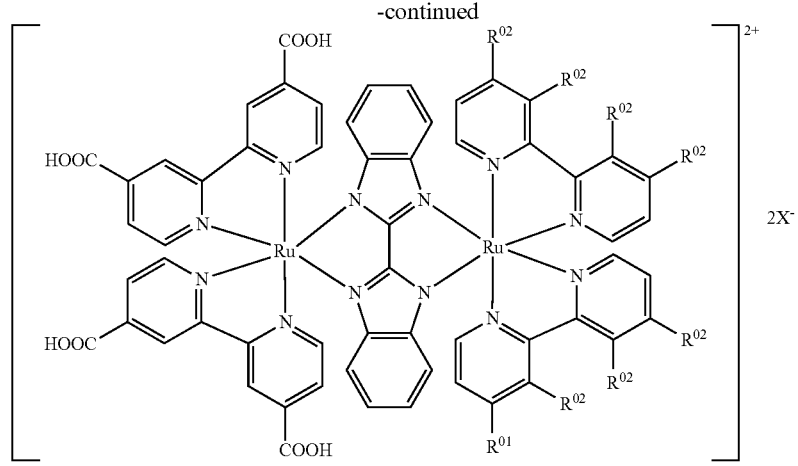
20
wherein $R^{02}$ is defined as above, X represents a monovalent anion being a counter ion, and Y and Z each independently represents a halogen atom.
The binuclear metal complex dye (B) may be also prepared by the synthesis method as shown in the following formula (hereinafter, referred to as "synthesis method (2-B)").
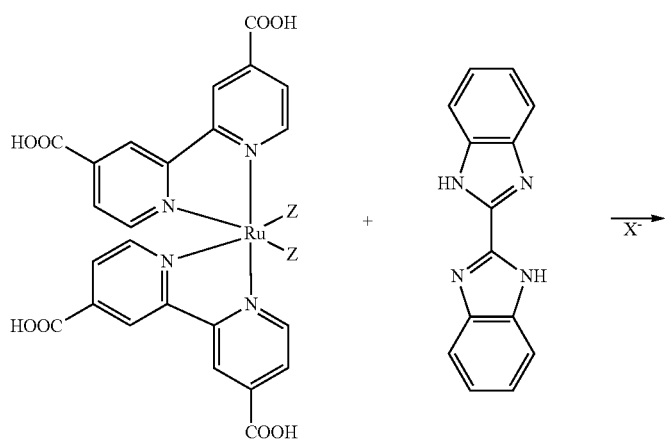
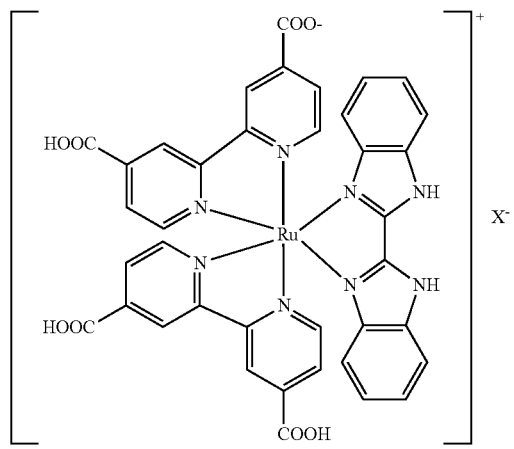

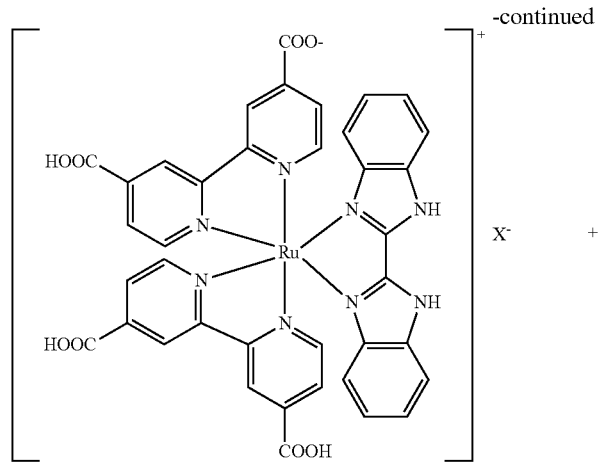
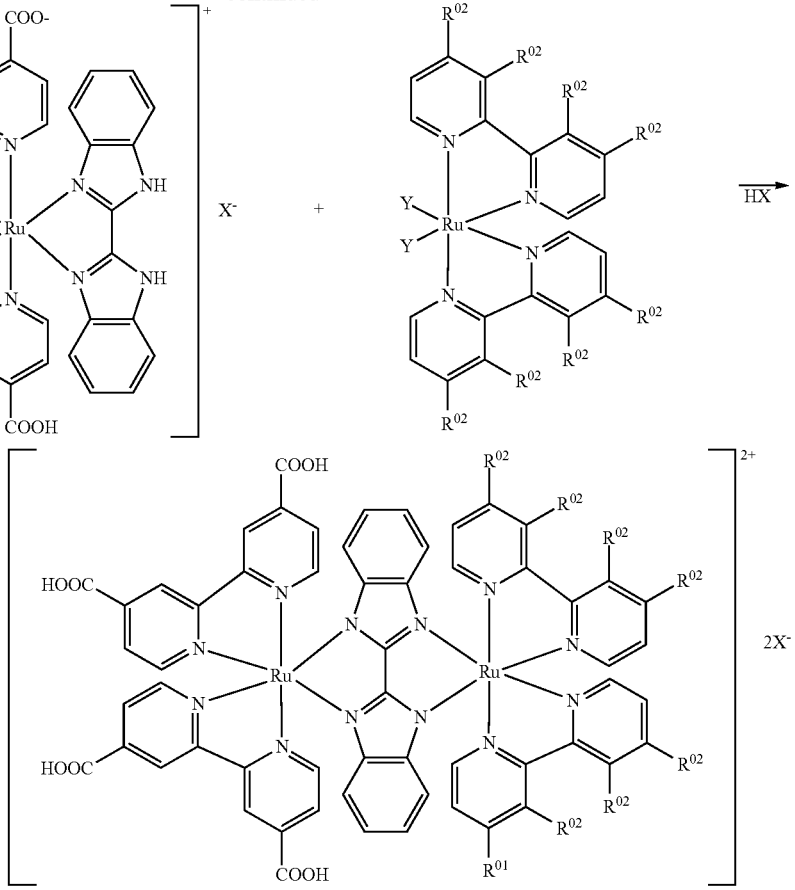

wherein $R^{02}$, $X^-$, Y and Z are defined as above.

The counter ion (X) is not limited to a monovalent anion, and other complex dyes may be synthesized in the same way as described above.

One of the mononuclear ruthenium complexes may be synthesized via a mononuclear ruthenium complex precursor. The synthetic intermediate, i.e. the mononuclear ruthenium complex precursor represented by the general formula (2-2) as described above, the mononuclear ruthenium complex represented by the general formula (2-3) as described above, and the mononuclear ruthenium complex represented by the general formula (2-4) as described above are novel compounds.

In the binuclear metal complex dye (B), proton(s) ($H^+$) of one or more carboxyl groups (—COOH) may dissociate. The dissociation of proton ($H^+$) may be achieved mainly by adjusting the pH of the metal complex dye solution.

The Third Metal Complex Dye of the Present Invention (Binuclear Metal Complex Dye (C))

The third metal complex dye of the present invention (binuclear metal complex dye (C)) is represented by the general formula (3-1) as described above. In the general formula (3-1), $R^1$, $R^2$, $R^3$, $R^4$, $R^5$, $R^6$, $R^7$ and $R^8$ each independently represents a hydrogen atom or a hydrophobic substituent, particularly a hydrocarbon group, with the proviso that the case where $R^1$, $R^2$, $R^3$, $R^4$, $R^5$, $R^6$, $R^7$ and $R^8$ are all hydrogen atoms is excluded. The hydrophobic substituent may be, for example, an alkyl group such as methyl group, ethyl group, propyl group and butyl group; an aralkyl group such as benzyl group and phenethyl group; or an aryl group such as phenyl group and tolyl group. The hydrophobic substituent may be preferably an alkyl group or an aryl group (more preferably phenyl group), more preferably an alkyl group. The hydrophobic substituent may be particularly preferably an alkyl group having 1 to 9 carbon atoms, more preferably methyl group. These groups include various isomers.

As for $R^1$ to $R^8$, it is particularly preferred that $R^3$ and $R^6$ are hydrophobic substituents, preferably alkyl groups having 1 to 9 carbon atoms, and others are hydrogen atoms. It is also particularly preferred that $R^4$ and $R^5$ are hydrophobic substituents, preferably alkyl groups having 1 to 9 carbon atoms, and others are hydrogen atoms. It is also particularly preferred that $R^2$, $R^3$, $R^6$ and $R^7$ are hydrophobic substituents, preferably alkyl groups having 1 to 9 carbon atoms, and others are hydrogen atoms.

X represents a counter ion. X may be, for example, hexafluorophosphate ion, perchlorate ion, tetraphenylborate ion, tetrafluoroborate ion, trifluoromethanesulfonate ion, thiocyanate ion, sulfate ion, nitrate ion, or halide ion. X may be preferably hexafluorophosphate ion, tetrafluoroborate ion, trifluoromethanesulfonate ion, nitrate ion or halide ion. X may be more preferably hexafluorophosphate ion, tetrafluoroborate ion, nitrate ion or iodide ion. In addition, n represents a number of the counter ions needed to neutralize a charge of the complex.

The binuclear metal complex dye (C) may be prepared by reacting two different mononuclear ruthenium complexes as shown in the following formula, for example, by reference to WO2006/038587 and the like.

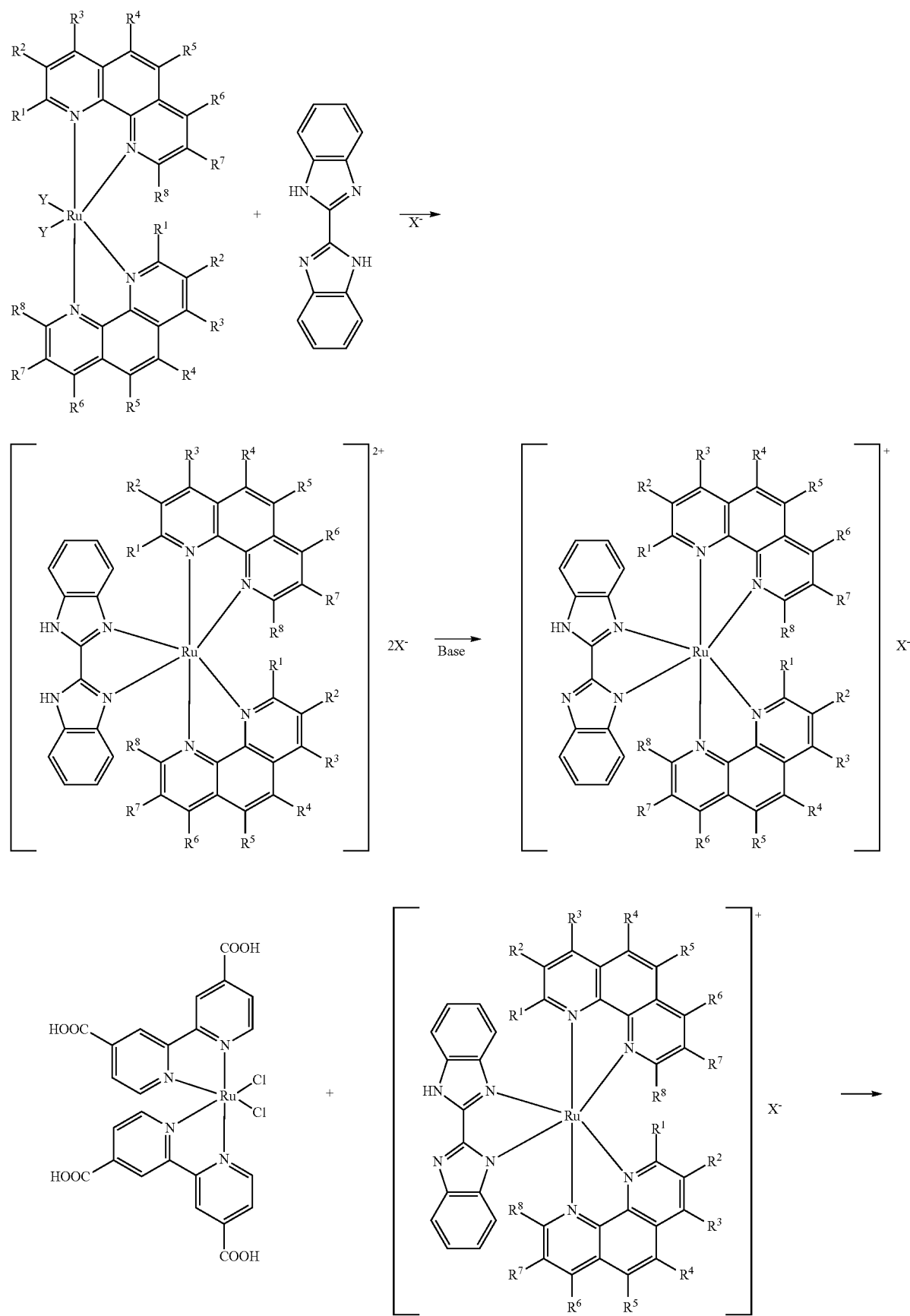

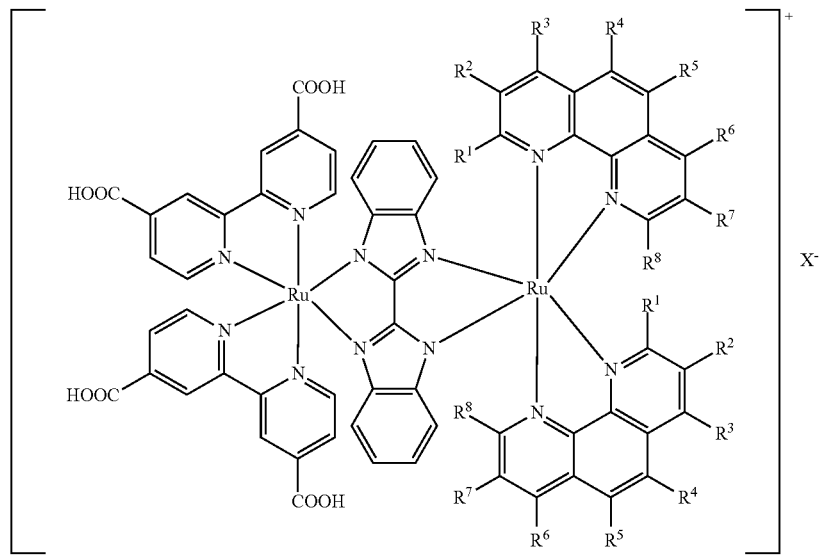

wherein $R^1$, $R^2$, $R^3$, $R^4$, $R^5$, $R^6$, $R^7$ and $R^8$ are defined as above, X represents a monovalent anion being a counter ion, and Y represents a halogen atom.

The counter ion (X) is not limited to a monovalent anion, and other complex dyes may be synthesized in the same way as described above.

One of the mononuclear ruthenium complexes may be synthesized via a mononuclear ruthenium complex precursor. The synthetic intermediate, i.e. the mononuclear ruthenium complex precursor represented by the general formula (3-2) as described above, and the mononuclear ruthenium complex represented by the general formula (3-3) as described above are novel compounds.

In the process of synthesizing the binuclear ruthenium complex, the mononuclear ruthenium complex represented by the general formula (3-3) is deprotonated by the action of a base to form the mononuclear ruthenium complex represented by the general formula (3-4) as described above, which is a novel compound.

In the binuclear metal complex dye (C), proton(s) ($H^+$) of one or more carboxyl groups (—COOH) may dissociate. The dissociation of proton ($H^+$) may be achieved mainly by adjusting the pH of the metal complex dye solution.

The Fourth Metal Complex Dye of the Present Invention (Binuclear Metal Complex Dye (D))

The fourth metal complex dye of the present invention (binuclear metal complex dye (D)) is represented by the general formula (4-1) as described above. In the general formula (4-1), $R^{04}$ represents a hydrophobic substituent, particularly a linear or branched alkyl group having 1 to 18 carbon atoms, a linear or branched alkoxy group having 1 to 18 carbon atoms, an aralkyl group having 6 to 15 carbon atoms, an aryl group having 6 to 15 carbon atoms, an aralkyloxy group having 6 to 15 carbon atoms, or an aryloxy group having 6 to 15 carbon atoms. $R^{04}$ may be, for example, an alkyl group such as methyl group, ethyl group, propyl group and butyl group; an alkoxy group such as methoxy group, ethoxy group, propoxy group and butoxy group; an aralkyl group such as benzyl group and phenethyl group; an aryl group such as phenyl group and tolyl group; an aralkyloxy group such as benzyloxy group and phenethyloxy group; or an aryloxy group such as phenoxy group and tolyloxy group. The $R^{04}$ may be preferably an alkyl group, an alkoxy group, an aryl group or an aryloxy group. The $R^{04}$ may be more preferably an alkyl group having 1 to 9 carbon atoms, phenyl group, tolyl group or phenoxy group, particularly preferably an alkyl group having 1 to 9 carbon atoms, more preferably methyl group. These groups include various isomers.

X represents a counter ion. X may be, for example, hexafluorophosphate ion, perchlorate ion, tetraphenylborate ion, tetrafluoroborate ion, trifluoromethanesulfonate ion, thiocyanate ion, sulfate ion, nitrate ion, or halide ion. X may be preferably hexafluorophosphate ion, tetrafluoroborate ion, trifluoromethanesulfonate ion, nitrate ion or halide ion. X may be more preferably hexafluorophosphate ion, tetrafluoroborate ion, nitrate ion or iodide ion. In addition, n represents a number of the counter ions needed to neutralize a charge of the complex.

The binuclear metal complex dye (D) may be prepared by reacting a mononuclear ruthenium complex and a mononuclear osmium complex as shown in the following formula, for example, by reference to WO2006/038587 and the like.

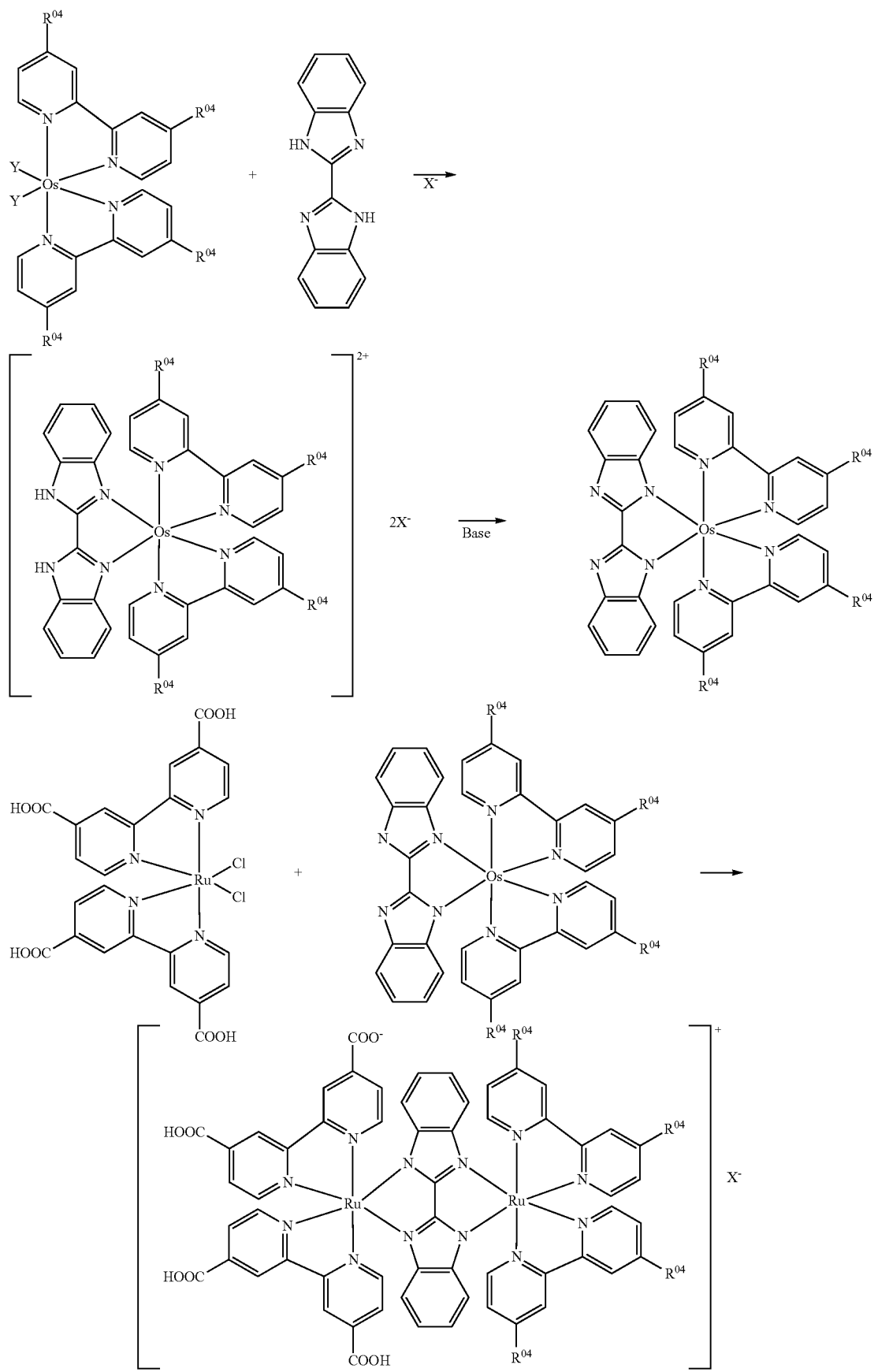

wherein $R^{04}$ is defined as above, $X^-$ represents a monovalent anion being a counter ion, and Y represents a halogen atom.

The counter ion (X) is not limited to a monovalent anion, and other complex dyes may be synthesized in the same way as described above.

The mononuclear osmium complex may be synthesized via a mononuclear osmium complex precursor. The synthetic intermediate, i.e. the mononuclear osmium complex precursor represented by the general formula (4-2) as described above, and the mononuclear osmium complex represented by the general formula (4-3) as described above are novel compounds.

The mononuclear osmium complex represented by the general formula (4-3) may have a NH-proton, as represented by the general formula (4-4).

In the binuclear metal complex dye (D), proton(s) ($H^+$) of one or more carboxyl groups (—COOH) may dissociate. The dissociation of proton ($H^+$) may be achieved mainly by adjusting the pH of the metal complex dye solution.

<The Photoelectric Conversion Element and Photochemical Cell of the Present Invention>

The photoelectric conversion element of the present invention comprises the binuclear ruthenium complex dye as described above or the ruthenium-osmium complex dye as described above, and a semiconductor particle. The binuclear ruthenium complex dye or the ruthenium-osmium complex dye is adsorbed on the surface of the semiconductor particle, and the semiconductor particle is sensitized with the metal complex dye.

More specifically, the photoelectric conversion element of the present invention comprises a semiconductor particle sensitized with the ruthenium complex dye or the ruthenium-osmium complex dye, which is fixed on a conductive support (electrode).

A conductive electrode may be preferably a transparent electrode, which is formed on a transparent substrate. Examples of a conducting agent include metals such as gold, silver, copper, platinum and palladium; indium oxide-based compounds, typified by tin-doped indium oxide (ITO); tin oxide-based compounds, typified by fluorine-doped tin oxide (FTO); and zinc oxide-based compounds.

Examples of the semiconductor particle include titanium oxide, zinc oxide and tin oxide. The other examples may include indium oxide; niobium oxide; tungsten oxide; vanadium oxide; composite oxide semiconductors such as strontium titanate, calcium titanate, barium titanate and potassium niobate; cadmium or bismuth sulfide; cadmium selenide or telluride; and gallium phosphide or arsenide. The semiconductor particle may be preferably an oxide, particularly preferably, for example, titanium oxide, zinc oxide, tin oxide, or a mixture comprising at least one of these.

A primary particle size of the semiconductor particle is not limited, but it is generally from 1 nm to 5,000 nm, preferably from 2 nm to 500 nm, particularly preferably from 5 nm to 400 nm.

The binuclear ruthenium complex dye or the ruthenium-osmium complex dye may be adsorbed onto the semiconductor particle, for example, by forming a semiconductor layer which comprises a semiconductor particle (semiconductor particle film) on a conductive support; and then immersing the semiconductor layer in a solution containing the metal complex dye. The semiconductor layer may be formed by applying a paste of semiconductor particle onto a conductive support; and then calcining the paste. Subsequently, the conductive support on which the semiconductor layer is formed is immersed in a solution containing the dye; and then washed and dried.

Examples of a solvent for the dye solution include water; alcohols such as methanol, ethanol, isopropyl alcohol, t-butyl alcohol and ethylene glycol; nitriles such as acetonitrile and propionitrile; amides such as N,N-dimethylacetamide and N,N-dimethylformamide; ureas such as N-methylpyrrolidone; and sulfoxides such as dimethylsulfoxide. The solvent to be used may be preferably water, an alcohol or a nitrile, more preferably water, ethanol, isopropyl alcohol, t-butanol or acetonitrile. These solvents may be used alone or in combination of two or more.

In the case of the first metal complex dye (binuclear metal complex dye (A)), the second metal complex dye (binuclear metal complex dye (B)) and the fourth metal complex dye (binuclear metal complex dye (D)) of the present invention, the concentration of the dye in the solution may be preferably from 0.001 mmol/l to the saturation concentration of the complex dye, more preferably from 0.001 mmol/l to 100 mmol/l, particularly preferably from 0.01 mmol/l to 10 mmol/l, and more preferably from 0.05 mmol/l to 1.0 mmol/l.

In the case of the third metal complex dye (binuclear metal complex dye (C)) of the present invention, the concentration of the dye in the solution may be preferably from 0.001 mmol/l to the saturation concentration of the complex dye, more preferably from 0.02 mmol/l to 0.05 mmol/l.

The dye solution may contain a compound having a steroid skeleton such as cholic acid, deoxycholic acid and chenodeoxycholic acid.

The temperature at which the dye is adsorbed onto a semiconductor particle is generally from 0° C. to 80° C., preferably from 20° C. to 40° C. The time period for which the dye is adsorbed onto a semiconductor particle (time period for which a semiconductor particle is immersed in the dye solution) may be appropriately selected depending on the type of the metal complex dye, the concentration of the dye in the solution, and other conditions.

The photochemical cell of the present invention comprises the photoelectric conversion element of the present invention as described above. More specifically, it comprises the photoelectric conversion element of the present invention as described above, and a counter electrode as electrodes; and comprises an electrolyte layer between the electrodes. At least one of the electrode, which is the photoelectric conversion element of the present invention, and the counter electrode is a transparent electrode.

The counter electrode functions as a cathode when it is combined with the photoelectric conversion element to form a photochemical cell. Although a substrate on which a conductive layer is formed may be used as a counter electrode, like the conductive electrode as described above, a substrate is not necessarily required for a counter electrode, for example, a metal plate itself may be used as a counter electrode. Examples of a conducting agent to be used for the counter electrode include metals such as platinum and carbon; and conductive metal oxides such as fluorine-doped tin oxide.

The electrolyte (redox couple) may be selected from any known materials without limitations. Examples of the electrolyte to be used include a combination of iodine and an iodide (for example, metal iodides such as lithium iodide and potassium iodide, or iodides of a quaternary ammonium compound such as tetrabutylammonium iodide, tetrapropylammonium iodide, pyridinium iodide and imidazolium iodide); a combination of bromine and a bromide; a combination of chlorine and a chloride; a combination of an alkylviologen and a reductant thereof; quinone/hydroquinone; transition metal ion pair such as iron (II) ion/iron (III) ion, copper (I) ion/copper (II) ion, manganese(II) ion/manganese(III) ion, and cobalt (II) ion/cobalt (III) ion; a combination of complex ions such as ferrocyanide/ferricyanide, cobalt (II) tetrachloride/cobalt (III) tetrachloride, cobalt (II) tetrabromide/cobalt (III) tetrabromide, iridium(II) hexachloride/iridium (III) hexachloride, ruthenium (II) hexacyanide/ruthenium (III) hexacyanide, rhodium(II) hexachloride/rhodium(III) hexachloride, rhenium (III) hexachloride/rhenium (IV) hexachloride, rhenium (IV) hexachloride/rhenium (V) hexachloride, osmium (III) hexachloride/osmium (IV) hexachloride, and osmium (IV) hexachloride/osmium (V) hexachloride; complexes formed with a transition metals such as cobalt, iron, ruthenium, manganese, nickel and rhenium, and a conjugated heterocyclic ring and derivative thereof such as bipyridine and derivative thereof, terpyridine and derivative thereof, and phenanthroline and derivative thereof; complexes of cyclopentadiene or derivative thereof and a metal such as ferrocene/ferrocenium ion, cobaltocene/cobaltocenium ion, and ruthenocene/ruthenocenium ion; and porphyrin compounds. A preferable electrolyte may be a combination of iodine and lithium iodide or an iodide of a quaternary ammonium compound. The electrolyte may be a solution in an organic solvent, a molten salt, a so-called gel electrolyte in which the electrolyte is impregnated in a polymer matrix, or a solid electrolyte.

Examples of a solvent for the electrolyte solution include, but not limited to, water, alcohols, nitriles, chain ethers, cyclic ethers, chain esters, cyclic esters, chain amides, cyclic amides, chain sulfones, cyclic sulfones, chain ureas, cyclic ureas, and amines. These solvents may be used alone or in combination of two or more.

The photochemical cell of the present invention may be produced by any conventional process.

For example, the photochemical cell of the present invention may be produced as follows. As described above, a paste of semiconductor particle such as an oxide is applied onto a transparent electrode, and then calcined, to form a semiconductor particle film. In the case where the semiconductor particle film is titania, the paste is calcined at a temperature of from 450° C. to 500° C. for 30 minutes, for example. The transparent electrode with the semiconductor particle film is immersed in a dye solution (a solution containing the binuclear metal complex dye of the present invention) for supporting the dye on the semiconductor particles, to produce a photoelectric conversion element. Then, the photoelectric conversion element is combined with a transparent electrode on which platinum or carbon is vapor-deposited as a counter electrode, and an electrolyte is placed between them, to produce the photochemical cell of the present invention.

EXAMPLES

The present invention will be described in more detail below with reference to the Examples. However, the scope of the present invention is not limited to the Examples.

Abbreviations used in the Examples are as follows:
$H_2$dcbpy; 2,2'-bipyridine-4,4'-dicarboxylic acid,
BiBzImH$_2$; 2,2'-bibenzimidazole,
4,4'-dtbbpy; 4,4'-di-t-butyl-2,2'-bipyridine,
4,4'-dnbpy; 4,4'-di-n-nonyl-2,2'-bipyridine,
bpy; 2,2'-bipyridine,
1,1'-biq; 1,1'-biisoquinoline,
Qxphen; dipyrido[3,2-a:2',3'-c]phenazine,
cod; 1,5-cyclooctadiene,
phen; 1,10-phenanthroline,
4,7-dmphen; 4,7-dimethyl-1,10-phenanthroline,
5,6-dmphen; 5,6-dimethyl-1,10-phenanthroline,
3,4,7,8-tmphen; 3,4,7,8-tetramethyl-1,10-phenanthroline,
4,7-dipphen; 4,7-diphenyl-1,10-phenanthroline,
4,4'-dmbpy; 4,4'-di-methyl-2,2'-bipyridine.

Reference Example 1-1

<Synthesis of the mononuclear ruthenium complex (M-1) [($H_2$dcbpy)$_2$RuCl$_2$]>

Under nitrogen atmosphere, into a 500 mL three-necked flask were placed commercially available RuCl$_3$.3H$_2$O (2.53 g, 9.68 mmol), H$_2$dcbpy (4.50 g, 18.4 mmol) and N,N-dimethylformamide (300 mL), and the mixture was refluxed for 45 minutes while being stirred under irradiation with 2.45 GHz microwave. After cooling down, the reaction liquid was filtered, and the resultant filtrate was concentrated under reduced pressure. The resultant concentrate was washed with acetone/diethyl ether (1:4), and then 2 mol/l hydrochloric acid (300 mL) was added. The mixture was stirred with ultrasonic for 20 minutes, and then stirred for 2 hours without ultrasonic. After completion of stirring, an insoluble substance was collected by filtration, washed with 2 mol/l hydrochloric acid, acetone/diethyl ether (1:4) and diethyl ether, and then dried under vacuum. The mononuclear ruthenium complex (M-1) (5.75 g) was obtained.

Example A-1-2

<Synthesis of the mononuclear ruthenium complex (A-M-2a) [[(BiBzImH)Ru(4,4'-dtbbpy)$_2$](PF$_6$)] (the complex of the formula (1-3) in which $R^{01}$=t-butyl group)>

Under nitrogen atmosphere, into a 100 mL three-necked flask were placed Ru(4,4'-dtbbpy)$_2$Cl$_2$ (3.49 g, 4.93 mmol), 2,2'-bibenzimidazole (BiBzImH$_2$) (1.2736 g, 5.44 mmol) and 2-methoxyethanol (100 mL), and the mixture was refluxed for 15 minutes under irradiation with 2.45 GHz microwave. After cooling down, water (100 mL) was added to the reaction liquid to precipitate unreacted bibenzimidazole, which was filtrated off. An aqueous solution of ammonium hexafluorophosphate (NH$_4$PF$_6$) was added to the resultant filtrate to precipitate a solid. The precipitate was collected by filtration, washed with water and diethyl ether, and then dried under vacuum. The mononuclear ruthenium complex precursor (A-M-2aH) ([(BiBzImH$_2$)Ru(4,4'-dtbbpy)$_2$](PF$_6$)$_2$) (5.38 g) was obtained.

Then, under nitrogen atmosphere, into a 300 mL recovery flask were placed [(BiBzImH$_2$)Ru(4,4'-dtbbpy)$_2$](PF$_6$)$_2$ (5.00 g, 4.31 mmol) and methanol (100 mL), and then 10% lithium methoxide methanol solution (40 mL) was added dropwise thereto. The resultant suspension was refluxed for 3 hours while being stirred, and then the reaction liquid was cooled to room temperature. The precipitate was collected by filtration, washed with cold methanol and diethyl ether, and then dried under vacuum. The mononuclear ruthenium complex (A-M-2a) (3.19 g) was obtained.

Example A-1

<Synthesis of the binuclear ruthenium complex dye (A-1a) [[($H_2$dcbpy)(Hdcbpy)Ru(BiBzIm)Ru(4,4'-dtbbpy)$_2$](PF$_6$)] (the complex of the formula (1-1) in which $R^{01}$=t-butyl group)>

Under argon atmosphere, the mononuclear ruthenium complex (M-1) (1.01 g, 1.46 mmol) and water (20 mL) were placed into a 50 mL sample tube, and then 1 mol/l tetrabutylammonium hydroxide aqueous solution (5.8 mL) was added dropwise thereto and dissolved therein. The resultant solution was concentrated under reduced pressure, and the resultant concentrate was dissolved in 2-methoxyethanol (100 mL)

and transferred into a 300 mL three-necked flask. Then, the mononuclear ruthenium complex (A-M-2a) (1.26 g, 1.24 mmol) was added to the solution, and the mixture was refluxed for 20 minutes while being stirred under irradiation with 2.45 GHz microwave. After cooling down, the reaction liquid was filtered, and the resultant filtrate was concentrated under reduced pressure. And then, water (150 mL) and methanol (250 mL) were added to the resultant concentrate and dissolved therein. The resultant solution was filtrated, and 0.5 mol/l hexafluorophosphoric acid aqueous solution was added dropwise to the resultant filtrate until pH became 2.5. After the resultant mixture was cooled at 4° C. overnight, the precipitate was collected by filtration, washed with hexafluorophosphoric acid aqueous solution at pH 2.5, acetone/diethyl ether (4:1) and diethyl ether, and then dried under vacuum. The crude binuclear ruthenium complex dye (A-1a) (2.15 g) was obtained.

Then, the obtained crude binuclear ruthenium complex dye (A-1a) (2.14 g) and water (150 mL) were placed into a 150 mL sample tube, and 1 mol/l lithium hydroxide aqueous solution (3.2 mL) was added dropwise thereto and dissolved therein. The resultant solution was filtrated, and 0.5 mol/l hexafluorophosphoric acid aqueous solution was added dropwise to the resultant filtrate until pH became 2.8. After the resultant mixture was cooled overnight, the precipitated complex was collected by filtration, washed with hexafluorophosphoric acid aqueous solution at pH 2.8, acetone/diethyl ether (4:1) and diethyl ether, and then dried under vacuum. The binuclear ruthenium complex dye (A-1a) (1.68 g) was obtained.

Example A-2-2

<Synthesis of the mononuclear ruthenium complex (A-M-2b) [[(BiBzImH)Ru(4,4'-dnbpy)$_2$](PF$_6$)] (the complex of the formula (1-3) in which $R^{o1}$=n-nonyl group)>

Under nitrogen atmosphere, into a 100 mL three-necked flask were placed Ru(4,4'-dnbpy)$_2$Cl$_2$ (0.979 g, 0.99 mmol), 2,2'-bibenzimidazole (BiBzImH$_2$) (0.258 g, 1.10 mmol) and ethylene glycol (40 mL), and the mixture was refluxed for 5 minutes while being stirred under irradiation with 2.45 GHz microwave. After allowing the reaction liquid to cool down, water (25 mL), ethanol (25 mL) and ammonium hexafluorophosphate (NH$_4$PF$_6$) aqueous solution were added to precipitate a solid. The precipitate was collected by filtration, washed with water, and then dried under vacuum. The mononuclear ruthenium complex precursor (A-M-2bH) ([(BiBzImH$_2$)Ru(4,4'-dnbpy)$_2$](PF$_6$)$_2$) (1.27 g) was obtained.

Then, under nitrogen atmosphere, [(BiBzImH$_2$)Ru(4,4'-dnbpy)$_2$](PF$_6$)$_2$ (1.22 g, 0.88 mmol) and methanol (10 mL) were placed into a 100 mL recovery flask, and then 10% lithium methoxide methanol solution (3.8 mL) was added dropwise thereto. The resultant suspension was refluxed for 1 hour while being stirred. After allowing the reaction liquid to cool down, water (50 mL) was added thereto, and an insoluble substance and a precipitate were collected by filtration, washed with water, and then dried under vacuum. The mononuclear ruthenium complex (A-M-2b) (1.05 g) was obtained.

Example A-2

<Synthesis of the binuclear ruthenium complex dye (A-1b) [[(H$_2$dcbpy)(Hdcbpy)Ru(BiBzIm)Ru(4,4'-dnbpy)$_2$](PF$_6$)] (the complex of the formula (1-1) in which $R^{o1}$=n-nonyl group)>

Under nitrogen atmosphere, the mononuclear ruthenium complex (M-1) (0.25 g, 0.36 mmol) and ethanol/water (3:1) (100 mL) were placed into a 300 mL three-necked flask, and then 1 mol/l lithium hydroxide aqueous solution (1.45 mL) was added dropwise thereto and dissolved therein. The mononuclear ruthenium complex (A-M-2b) (0.457 g, 0.40 mmol) was added to the resultant solution, and the mixture was refluxed for 30 minutes while being stirred under irradiation with 2.45 GHz microwave. After allowing the reaction liquid to cool down, ethanol (50 mL) was added thereto, and again the mixture was refluxed for 10 minutes while being stirred under irradiation with 2.45 GHz microwave. After cooling down, the reaction liquid was filtered, and the resultant filtrate was concentrated under reduced pressure. And then, water (100 mL) was added to the resultant concentrate, and the resultant solution was filtered through Celite. And then, 0.5 mol/l hexafluorophosphoric acid aqueous solution was added dropwise to the resultant filtrate until pH became 2.8. After the resultant mixture was cooled at 4° C. overnight, the precipitate was collected by filtration, washed with hexafluorophosphoric acid aqueous solution at pH 2.8, acetone/diethyl ether (4:1) and diethyl ether, and then dried under vacuum. The binuclear ruthenium complex dye (A-1b) (0.53 g) was obtained.

Example A-3

Using the binuclear ruthenium complex dye (A-1a) obtained in Example A-1, the binuclear ruthenium complex dye (A-1b) obtained in Example A-2, and a known binuclear ruthenium complex dye (A-2) [[(H$_2$dcbpy)(Hdcbpy)Ru(BiBzIm)Ru(bpy)$_2$](PF$_6$)] (the complex of the formula (1-1) in which $R^{o1}$=H)), photochemical cells were produced as follows.

<Production of a Porous Titania Electrode>

A titania paste PST-18NR for a transparent layer and a titania paste PST-400C for a diffusion layer, both of which were made by Catalysts & Chemicals Industries Co., Ltd., were applied onto a transparent conductive glass electrode, which was made by Asahi Glass Co., Ltd., using a screen printer. The film thus obtained was aged in an atmosphere at 25° C. and 60% RH for 5 minutes, and then the aged film was calcined at 450° C. for 30 minutes. After the film was cooled down, the same procedure was repeated to achieve the predetermined thickness, thereby producing a 16 mm$^2$ porous titania electrode.

<Production of a Dye-Adsorbed Porous Titania Electrode>

A 0.2 mmol/l binuclear ruthenium complex dye solution [solvent:mixed solvent of t-butanol and acetonitrile (1:0] was prepared. The porous titania electrode was immersed in the dye solution at 30° C. for the predetermined time period, and then the electrode was dried, to provide a dye-adsorbed porous titania electrode.

<Production of a Photochemical Cell>

The dye-adsorbed porous titania electrode thus obtained was placed on a platinum plate (counter electrode). Subsequently, an electrolyte (a solution prepared by dissolving lithium iodide, iodine, 4-t-butylpyridine and 1,2-dimethyl-3-propylimidazolium iodide in 3-methoxypropionitrile in an amount of 0.1 mol/L, 0.05 mol/L, 0.5 mol/L and 0.6 mol/L, respectively) was poured into a gap between these electrodes by the capillary action, to provide a photochemical cell.

<Measurement of Conversion Efficiency>

The photoelectric conversion efficiency of the photochemical cell obtained was measured under irradiation with artificial solar light at 100 mW/cm$^2$, using a solar simulator made by EKO Instruments Co., Ltd.

FIG. 1 shows the conversion efficiency of the binuclear ruthenium complex dyes (A-1a) and (A-1b), and the known binuclear ruthenium complex dye (A-2) with respect to the adsorption time (time period for which the porous titania electrode was immersed in the dye solution).

As seen from the results given in FIG. 1, the binuclear ruthenium complex dyes (A-1a) and (A-1b) of the present invention exhibited the highest photoelectric conversion efficiency at the adsorption time of 5 hours, while the known binuclear ruthenium complex dye (A-2) exhibited the highest photoelectric conversion efficiency at the adsorption time of as long as 20 hours. In addition, the binuclear ruthenium complex dyes (A-1a) and (A-1b) of the present invention had a high photoelectric conversion efficiency of 7.4% and 7.1%, respectively, while the known binuclear ruthenium complex dye (A-2) had a photoelectric conversion efficiency of 6.3% at the highest. The results indicate that the binuclear ruthenium complex dyes (A-1a) and (A-1b) of the present invention may be promising for producing a high-performance photochemical cell, and have the advantages in industrial production.

Example B-1A-2

<Synthesis of the mononuclear ruthenium complex (B-M-2a) [[(BiBzIm)Ru(1,1'-biq)$_2$]] (the complex of the formula (2-3) in which $R^{02}$s present on a pyridine ring are bonded to each other to form a benzene ring) according to the synthesis method (2-A)>

Under nitrogen atmosphere, nickel chloride hexahydrate (4.61 g, 19.4 mmol), triphenylphosphine (20.2 g, 76.9 mmol) and N,N-dimethylformamide (90 mL) were placed into a 300 mL three-necked flask, and then zinc powder (1.26 g, 19.2 mmol) was added. The mixture was stirred for 75 minutes at 65° C. And then, 1-bromoisoquinoline (4.00 g, 19.2 mmol) was added, and the mixture was stirred for 5 hours at 140° C. After the completion of the reaction, the zinc powder was filtrated off, and the filtrate was concentrated under reduced pressure. And then, dichloromethane (50 mL) and 7% aqueous ammonia (120 mL) were added to the resultant concentrate, and the mixture was stirred for 30 minutes at room temperature. And then, nickel was removed from the mixture with dichloromethane/7% aqueous ammonia, and the desired product was transferred into an aqueous phase with diethyl ether/9 mol/l hydrochloric acid to remove triphenylphosphine. And then, the solution was neutralized with 5 mol/l aqueous sodium hydroxide solution, and the desired product was extracted with dichloromethane. After concentration under reduced pressure, the product was recrystallized with methanol, and 1,1'-biisoquinoline (1,1'-biq) (1.52 g) was obtained.

Then, under nitrogen atmosphere, into a 100 mL three-necked flask were placed 1,1'-biisoquinoline (1.02 g, 3.97 mmol), [Ru(cod)Cl$_2$]$_n$ (0.556 g, 1.99 mol) and N,N-dimethylformamide (60 mL), and the mixture was refluxed for 32 minutes while being stirred under irradiation with 2.45 GHz microwave. After cooling down, the reaction liquid was concentrated under reduced pressure, and acetone (15 mL) was added to the resultant concentrate and an insoluble substance was collected by filtration. The insoluble substance was washed with diethyl ether, and then dried under vacuum. Thus [Ru(1,1'-biq)$_2$Cl$_2$] (0.965 g) was obtained.

Then, under nitrogen atmosphere, into a 300 mL three-necked flask were placed [Ru(1,1'-biq)$_2$Cl$_2$] (0.896 g, 1.31 mmol), 2,2'-bibenzimidazole (BiBzImH$_2$) (0.369 g, 1.57 mmol) and ethylene glycol (140 mL), and the mixture was refluxed for 32 minutes while being stirred under irradiation with 2.45 GHz microwave. After cooling down, water (140 mL) was added to the reaction liquid, and the mixture was stirred for 1 hour at room temperature. And then, an insoluble substance was removed from the mixture by suction filtration, and the resultant filtrate was washed with ethylene glycol/water (1:1). And then, ammonium hexafluorophosphate (0.854 g, 5.24 mmol) dissolved in water (2 mL) was added to the filtrate, and the mixture was stirred for 2 hours and 40 minutes at room temperature. The precipitate was collected by filtration, washed with ethylene glycol/water (1:1), and then dried under vacuum. The mononuclear ruthenium complex precursor (B-M-2aH) ([(BiBzImH$_2$)Ru(1,1'-biq)$_2$] (PF$_6$)$_2$) (1.30 g) was obtained.

Then, under nitrogen atmosphere, into a 50 mL three-necked flask were placed the mononuclear ruthenium complex precursor (B-M-2aH) (0.499 g, 0.439 mmol), methanol (23 mL) and 28% sodium methoxide methanol solution (0.853 mL, 4.42 mmol), and the mixture was refluxed for 1.5 hours. After cooling down, an insoluble substance was collected by filtration, washed with 3.71% (the same concentration as the reaction solution) sodium methoxide methanol solution, and then dried under vacuum. The mononuclear ruthenium complex (B-M-2a) (0.312 g) was obtained.

Example B-1A

<Synthesis of the binuclear ruthenium complex dye (B-1) [[(H$_2$dcbpy)$_2$Ru(BiBzIm)Ru(1,1'-biq)$_2$](PF$_6$)$_2$] (the complex of the formula (2-1) in which $R^{02}$s present on a pyridine ring are bonded to each other to form a benzene ring) according to the synthesis method (2-A)>

The mononuclear ruthenium complex (M-1) (0.201 g, 0.289 mmol), water (50 mL) and 1 N aqueous sodium hydroxide solution (1.1 mL) were placed into a 150 mL sample tube. After adjusting pH to 10.5, the mixture was transferred into a 200 mL three-necked flask. And then, the mononuclear ruthenium complex (B-M-2a) (0.296 g, 0.350 mmol) and N,N-dimethylformamide (50 mL) were added to the solution. After deaeration with nitrogen, the mixture was refluxed for 35 minutes while being stirred under irradiation with 2.45 GHz microwave. After cooling down, an insoluble substance was collected by filtration, and washed with the mixture of N,N-dimethylformamide (50 mL) and water (50 mL) to which 1 N aqueous sodium hydroxide solution (1.1 mL) was added, and the resultant filtrate was evaporated to dryness. And then, water (50 mL) was added to the dried residue obtained, and the mixture was stirred for 1 hour at room temperature. And then, an insoluble substance was collected by filtration, and washed with water. The pH of the filtrate was adjusted to 2.2 with 0.5 M hexafluorophosphoric acid aqueous solution and 1.7 M hexafluorophosphoric acid aqueous solution. After allowing the solution to stand overnight, a precipitate was collected by filtration, washed with hexafluorophosphoric acid aqueous solution at pH 2.2, acetone/diethyl ether (1:4) and diethyl ether, and then dried under vacuum. The binuclear ruthenium complex dye (B-1) (0.156 g) was obtained.

Example B-1B-1

<Synthesis of the mononuclear ruthenium complex [(H$_2$dcbpy)$_2$Ru(BiBzImH)](PF$_6$) according to the synthesis method (2-B)>

The mononuclear ruthenium complex (M-1) (0.959 g, 1.378 mmol), water (65 mL) and 1 N aqueous sodium hydroxide solution (5.68 mL) were placed into a 100 mL sample tube. After adjusting pH to 10.2, the mixture was transferred into a 300 mL three-necked flask. And then, 2,2'-bibenzimidazole (BiBzImH$_2$) (0.423 g, 1.808 mmol) and N,N-dimethylformamide (65 mL) were added to the solution. After deaeration with nitrogen, the mixture was refluxed for 30 minutes while being stirred under irradiation with 2.45 GHz microwave. After cooling down, an insoluble substance was collected by filtration, and washed with the mixture of N,N-dimethylformamide (50 mL) and water (50 mL) to which 1 N aqueous sodium hydroxide solution (2.5 mL) was added, and the resultant filtrate was evaporated to dryness. And then, water (65 mL) was added to the dried residue obtained, and the mixture was stirred for 3 hours at room temperature. And then, an insoluble substance was collected by filtration, and washed with water. The pH of the filtrate was adjusted to 2.5 with 0.5 M hexafluorophosphoric acid aqueous solution and 1.7 M hexafluorophosphoric acid aqueous solution. After allowing the solution to stand overnight, a precipitate was collected by filtration, washed with hexafluorophosphoric acid aqueous solution at pH 2.5, acetone/diethyl ether (1:4) and diethyl ether, and then dried under vacuum. The mononuclear ruthenium complex [(H$_2$dcbpy)$_2$Ru(BiBzImH)](PF$_6$) (1.21 g) was obtained.

Example B-1B

<Synthesis of the binuclear ruthenium complex dye (B-1) [[(H$_2$dcbpy)$_2$Ru(BiBzIm)Ru(1,1'-biq)$_2$](PF$_6$)$_2$] (the complex of the formula (2-1) in which R$^{02}$s present on a pyridine ring are bonded to each other to form a benzene ring) according to the synthesis method (2-B)>

The mononuclear ruthenium complex [(H$_2$dcbpy)$_2$Ru(BiBzImH)](PF$_6$) (0.402 g, 0.416 mmol), water (75 mL) and 1 N aqueous sodium hydroxide solution (2.18 mL) were placed into a 150 mL sample tube. After adjusting pH to 10.3, the mixture was transferred into a 300 mL three-necked flask. And then, Ru(1,1'-biq)$_2$Cl$_2$ (0.403 g, 0.589 mmol) and N,N-dimethylformamide (75 mL) were added to the solution. After deaeration with nitrogen, the mixture was refluxed for 20 minutes while being stirred under irradiation with 2.45 GHz microwave. After cooling down, an insoluble substance was collected by filtration, and washed with the mixture of N,N-dimethylformamide (50 mL) and water (50 mL) to which 1 N aqueous sodium hydroxide solution (1.25 mL) was added, and the resultant filtrate was evaporated to dryness. And then, water (75 mL) and 1 N aqueous sodium hydroxide solution (0.075 mL) were added to the dried residue obtained, and the mixture was stirred for 30 minutes at room temperature. And then, an insoluble substance was collected by filtration, and washed with water. The pH of the filtrate was adjusted to 2.4 with 0.5 M hexafluorophosphoric acid aqueous solution and 1.7 M hexafluorophosphoric acid aqueous solution. After allowing the solution to stand overnight, a precipitate was collected by filtration, washed with hexafluorophosphoric acid aqueous solution at pH 2.4, acetone/diethyl ether (1:4) and diethyl ether, and then dried under vacuum. The binuclear ruthenium complex dye (B-1) (0.401 g) was obtained.

Reference Example B-1-2

<Synthesis of the mononuclear ruthenium complex (B-M-2b) [[(BiBzIm)Ru(Qxphen)$_2$]]>

Into a 200 mL recovery flask were placed 1,10-phenanthroline-5,6-dione (1.09 g, 5.19 mmol) and ethanol (10 mL), and the mixture was stirred to provide a suspension. And then, 1,2-phenylenediamine (0.592 g, 5.20 mmol) and ethanol (40 mL) were added to the suspension, and the mixture was refluxed for 2 hours. After allowing the reaction liquid to stand overnight, an insoluble substance was collected by filtration, and washed with cold ethanol. And then, the product was recrystallized with ethanol, and dipyrido[3,2-a:2',3'-c]phenazine (Qxphen) (0.808 g) was obtained.

Then, under nitrogen atmosphere, into a 200 mL three-necked flask were placed Qxphen (2.01 g, 7.11 mmol), RuCl$_3$.3H$_2$O (0.929 g, 3.56 mmol), lithium chloride (1.22 g, 28.8 mmol) and N,N-dimethylformamide (68 mL), and the mixture was stirred for 7 hours at 150° C. After allowing the reaction liquid to stand overnight, water (140 mL) was added thereto, and an insoluble substance was collected by filtration, washed with water and acetone, and then dried under vacuum. Thus [Ru(Qxphen)$_2$Cl$_2$] (2.641 g) was obtained.

Then, under nitrogen atmosphere, into a 200 mL three-necked flask were placed [Ru(Qxphen)$_2$Cl$_2$] (0.334 g, 0.459 mmol), 2,2'-bibenzimidazole (BiBzImH$_2$) (0.129 g, 0.549 mmol) and ethylene glycol (40 mL), and the mixture was stirred for 5 hours at 203° C. After cooling down, water (40 mL) was added, and the mixture was stirred for 45 minutes at room temperature. And then, an insoluble substance was collected by filtration, and washed with ethylene glycol/water (1:1). And then, ammonium hexafluorophosphate (0.299 g, 1.832 mmol) dissolved in water (1 mL) was added to the resultant filtrate, and the mixture was stirred for 1 hour at room temperature. The precipitate was collected by filtration, washed with ethylene glycol/water (1:1), and then dried under vacuum. The mononuclear ruthenium complex precursor (B-M-2bH) ([(BiBzImH$_2$)Ru(Qxphen)$_2$](PF$_6$)$_2$) (0.264 g) was obtained.

Then, under nitrogen atmosphere, into a 100 mL three-necked flask were placed the mononuclear ruthenium complex precursor (B-M-2bH) (0.253 g, 0.213 mmol), methanol (15 mL) and 28% sodium methoxide methanol solution (0.411 mL, 2.13 mmol), and the mixture was refluxed for 1 hour. After cooling down, an insoluble substance was collected by filtration, washed with 2.7% (the same concentration as the reaction solution) sodium methoxide methanol solution, and then dried under vacuum. The mononuclear ruthenium complex (B-M-2b) (0.177 g) was obtained.

Reference Example B-1

<Synthesis of the binuclear ruthenium complex dye (B-2) [[(H$_2$dcbpy)$_2$Ru(BiBzIm)Ru(Qxphen)$_2$](PF$_6$)$_2$]>

The mononuclear ruthenium complex (M-1) (0.109 g, 0.157 mmol), water (30 mL) and 1 N aqueous sodium hydroxide solution (0.62 mL) were placed into a 50 mL sample tube. After adjusting pH to 10.35, the mixture was transferred into a 200 mL three-necked flask. And then, the mononuclear ruthenium complex (B-M-2b) (0.156 g, 0.173 mmol) and N,N-dimethylformamide (90 mL) were added to the solution. After deaeration with nitrogen, the mixture was refluxed for 45 minutes while being stirred under irradiation with 2.45 GHz microwave. After cooling down, an insoluble substance was collected by filtration, and washed with the mixture of N,N-dimethylformamide (30 mL) and water (30 mL) to which 1 N aqueous sodium hydroxide solution (0.62 mL) was added, and the resultant filtrate was evaporated to dryness. And then, water (50 mL) and 1 N aqueous sodium hydroxide solution (0.1 mL) were added to the dried residue obtained, and the mixture was stirred for 30 minutes at room temperature. And then, an insoluble substance was collected by filtration, and washed with water. The pH of the filtrate was adjusted to 2.4 with 0.5 M hexafluorophosphoric acid aqueous solution and 1.7 M hexafluorophosphoric acid aqueous solution. After allowing the solution to stand overnight, a precipitate was collected by filtration, washed with hexafluorophosphoric acid aqueous solution at pH 2.4, acetone/diethyl ether (1:4) and diethyl ether, and then dried under vacuum. The binuclear ruthenium complex dye (B-2) (0.0867 g) was obtained.

Example B-2

Production of a Photochemical Cell

Using the binuclear ruthenium complex dye (B-1) obtained in Example B-1B and the binuclear ruthenium complex dye (B-2) obtained in Reference Example B-1, photochemical cells were produced in the same way as in Example A-3.

Example B-3

Measurement of Ultraviolet-Visible Absorption Spectrum

Figure 2:
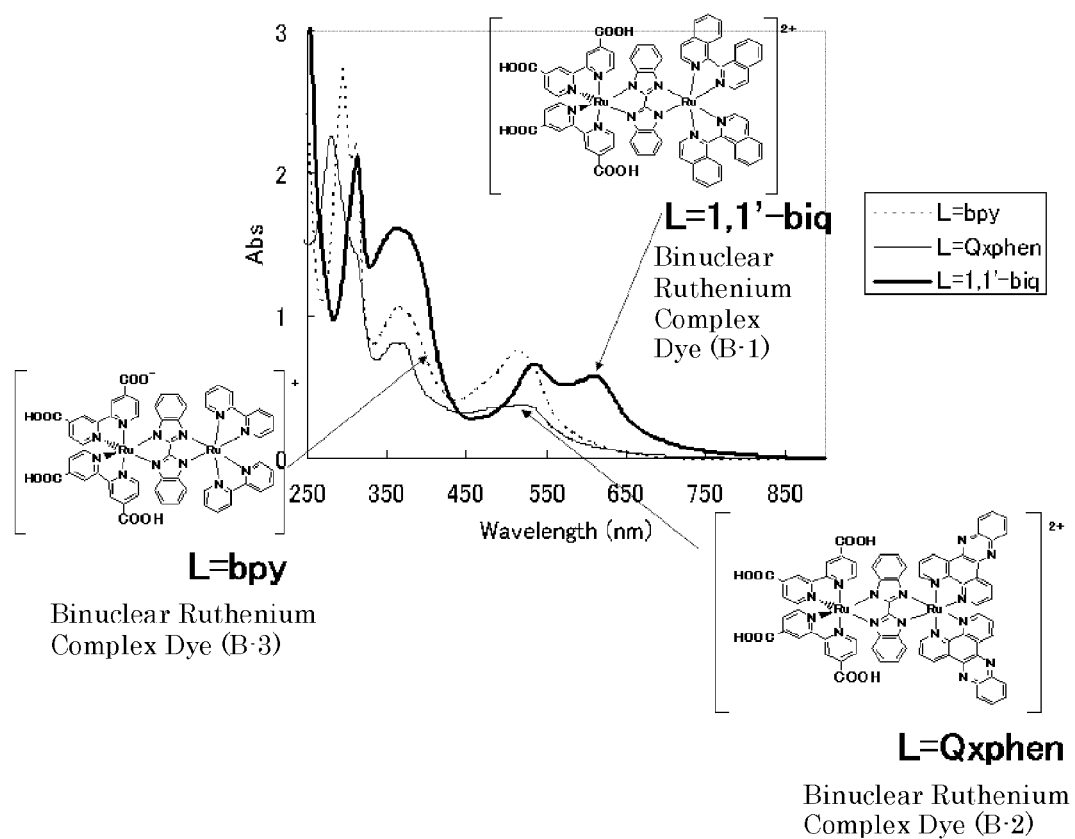
FIG. 2 is ultraviolet-visible absorption spectra of the binuclear ruthenium complex dye (B-1), the binuclear ruthenium complex dye (B-2) and a known binuclear ruthenium complex dye (B-3).

Three different types of $3 \times 10^{-5}$ mol/l solutions of dye in ethanol were prepared, and ultraviolet-visible absorption spectra of the solutions were measured. The dyes used were the binuclear ruthenium complex dye (B-1) obtained in Example B-1B, the binuclear ruthenium complex dye (B-2) obtained in Reference Example B-1, and a known binuclear ruthenium complex dye (B-3) [[(H$_2$dcbpy)(Hdcbpy)Ru(BiBzIm)Ru(bpy)$_2$](PF$_6$)] (the complex of the formula (2-1) in which $R^{02}$=H). The results are shown in FIG. 2.

As seen from the results given in FIG. 2, the binuclear ruthenium complex dye (B-1) of the present invention which contains rings (conjugated rings) formed along the axes between positions 3 and 4, and positions 3' and 4' of 2,2'-bipyridine ring (i.e. in the directions of the arrows (→) in the formula described below) had a light absorption wavelength range shifted by about 100 nm to longer wavelength, as compared with the known binuclear ruthenium complex dye (B-3) which contains a unsubstituted 2,2'-bipyridine ring. Accordingly, the metal complex dye of the present invention is expected to have the ability to convert light into electricity over a wider wavelength range. Meanwhile, the binuclear ruthenium complex dye (B-2) which contains conjugated rings formed along the axis between positions 3 and 3' of 2,2'-bipyridine ring had a light absorption wavelength range, which did not shift toward longer wavelength. The results revealed that a light absorption wavelength range depends greatly on the direction, or position, in which a ring, particularly a conjugated ring, is formed.

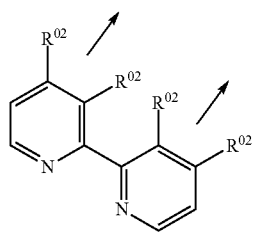

Example C-1-1

<Synthesis of the mononuclear ruthenium complex (M-1) [(H$_2$dcbpy)$_2$RuCl$_2$]>

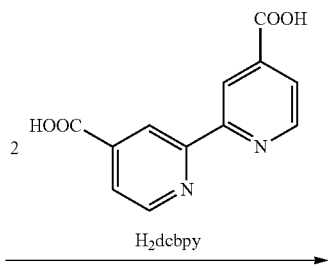

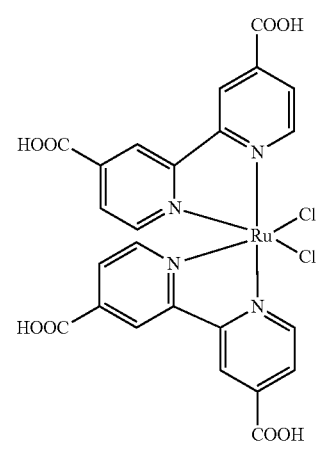

M-1

Under nitrogen atmosphere, into a 500 mL three-necked flask were placed commercially available RuCl$_3$.3H$_2$O (2.20 g, 8.42 mmol), H$_2$dcbpy (3.89 g, 15.95 mmol) and N,N-dimethylformamide (300 mL), and the mixture was refluxed for 45 minutes while being stirred under irradiation with 2.45 GHz microwave. After cooling down, the reaction liquid was filtered, and the resultant filtrate was concentrated under reduced pressure. The resultant concentrate was washed with acetone/diethyl ether (1:4), and then 2 mol/l hydrochloric acid (300 mL) was added. The mixture was stirred with ultrasonic for 30 minutes, and then stirred for 2 hours without ultrasonic. After completion of stirring, an insoluble substance was collected by filtration, washed with 2 mol/l hydrochloric acid, acetone/diethyl ether (1:4) and diethyl ether, and then dried under vacuum. The mononuclear ruthenium complex (M-1) (5.17 g) was obtained. The mononuclear ruthenium complex (M-1) obtained in Example C-1-1 was used in Example C-1, Example C-2, Example C-3 and Example C-4.

Example C-1-2

<Synthesis of the mononuclear ruthenium complex (C-M-2a) [[(BiBzImH)Ru(4,7-dmphen)$_2$](PF$_6$)] (the complex of the formula (3-3) in which $R^1$=$R^2$=$R^4$=$R^5$=$R^7$=$R^8$=hydrogen atom, and $R^3$=$R^6$=methyl group)>

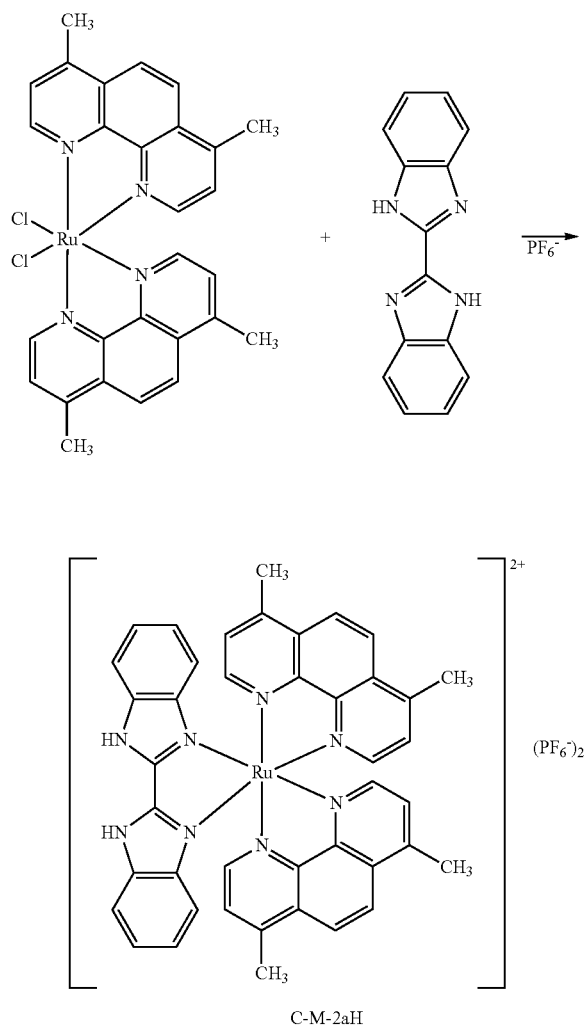

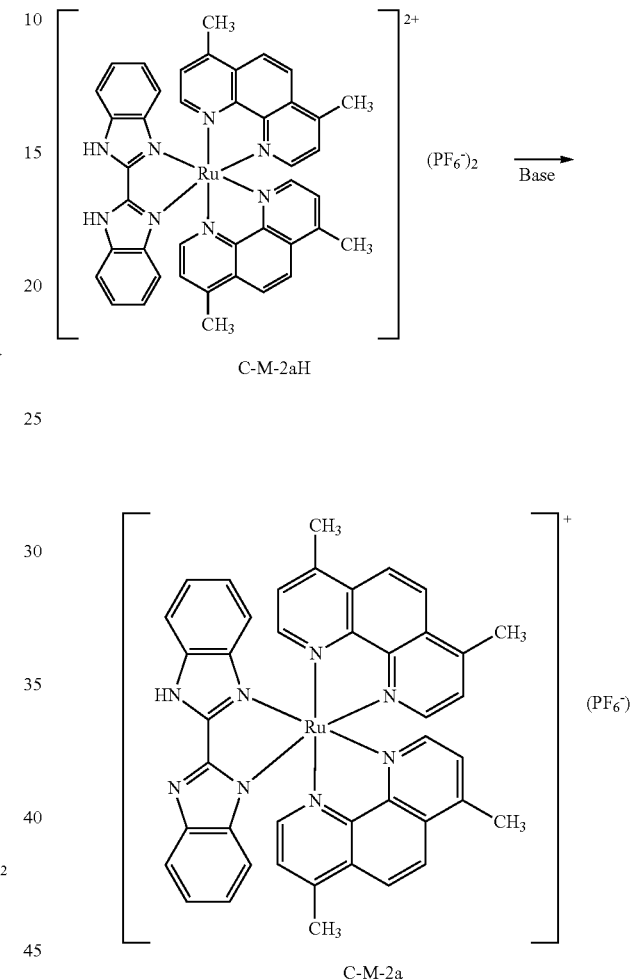

Under nitrogen atmosphere, into a 100 mL three-necked flask were placed [Ru(4,7-dmphen)$_2$Cl$_2$](Cl) (0.50 g, 0.76 mmol), BiBzImH$_2$ (0.21 g, 0.91 mmol) and ethylene glycol (25 mL), and the mixture was refluxed for 5 minutes while being stirred under irradiation with 2.45 GHz microwave. After allowing the reaction liquid to cool down, water (50 mL) and an aqueous solution of ammonium hexafluorophosphate (NH$_4$PF$_6$) were added to precipitate a solid. The precipitate was collected by filtration, washed with water, acetone/diethyl ether (1:4) and diethyl ether, and then dried under vacuum. The mononuclear ruthenium complex precursor (C-M-2aH) ([(BiBzImH$_2$)Ru(4,7-dmphen)$_2$](PF$_6$)$_2$) (0.69 g) was obtained.

Then, under nitrogen atmosphere, [(BiBzImH$_2$)Ru(4,7-dmphen)$_2$](PF$_6$)$_2$ (1.81 g, 1.73 mmol) and methanol (30 mL) were placed into a 100 mL Schlenk flask, and then 28% sodium methoxide methanol solution (3.47 mL) was added dropwise thereto. The resultant suspension was refluxed for 1 hour while being stirred, and then the reaction liquid was cooled to room temperature. The precipitate was collected by filtration, washed with cold methanol and diethyl ether, and then dried under vacuum. The mononuclear ruthenium complex (C-M-2a) (1.13 g) was obtained.

The complex was a novel compound, which had the following properties:

$^1$H-NMR (DMSO-d$_6$, δ (ppm)); 8.36-8.25 (m, 4H), 8.03-7.94 (dd, 4H), 7.59-7.51 (dd, 4H), 7.36 (d, 2H), 6.66 (t, 2H), 6.29 (t, 2H), 5.15 (t, 2H), 2.86-2.75 (dd, 12H).

Example C-1

<Synthesis of the binuclear ruthenium complex dye (C-1a) [[(H₂dcbpy)(Hdcbpy)Ru(BiBzIm)Ru(4,7-dmphen)₂](PF₆)] (the complex of the formula (3-1) in which $R^1=R^2=R^4=R^5=R^7=R^8$=hydrogen atom, and $R^3=R^6$=methyl group)>

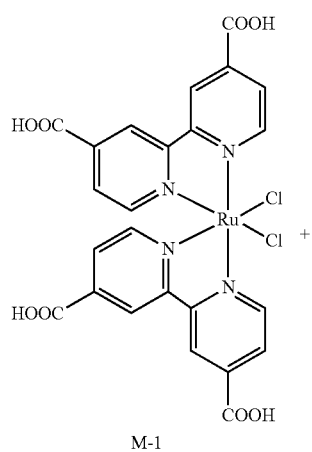

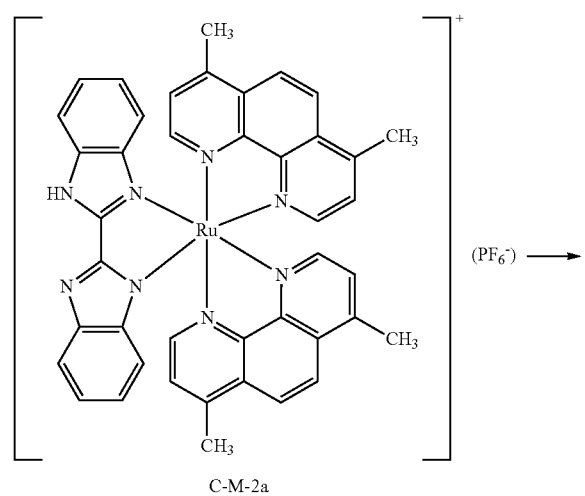

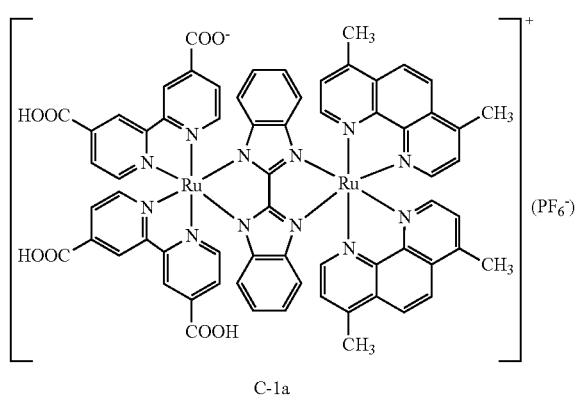

Under nitrogen atmosphere, into a 500 mL three-necked flask were placed the mononuclear ruthenium complex (M-1) (1.00 g, 1.44 mmol) and water (50 mL), and then 1 mol/l aqueous sodium hydroxide solution (5.55 mL) was added dropwise thereto and dissolved therein. And then, N,N-dimethylformamide (200 mL) and the mononuclear ruthenium complex (C-M-2a) (1.08 g, 1.44 mmol) were added to the resultant solution. The mixture was refluxed for 30 minutes while being stirred under irradiation with 2.45 GHz microwave. After cooling down, the reaction liquid was filtrated, and the resultant filtrate was concentrated under reduced pressure. And then, water (70 mL) was added to the resultant concentrate and dissolved therein. And then, the solution was filtrated, and 0.5 mol/l hexafluorophosphoric acid aqueous solution was added dropwise to the filtrate until pH became 3.0. After the resultant mixture was cooled at 4° C. overnight, the precipitate was collected by filtration, washed with hexafluorophosphoric acid aqueous solution at pH 3.0, acetone/diethyl ether (1:4) and diethyl ether, and then dried under vacuum. The binuclear ruthenium complex dye (C-1a) (0.57 g) was obtained.

The complex was a novel compound, which had the following properties:

¹H-NMR (DMSO-d₆, δ (ppm)); 9.06 (brs, 3H), 8.52-8.12 (m, 10H), 7.95-7.86 (m, 5H), 7.73-7.54 (m, 7H), 6.59 (dd, 2H), 6.49 (dd, 2H), 5.52 (t, 2H), 5.32 (m, 2H), 2.89 (s, 12H).

Mass spectrometry (ESI-MS, solvent: methanol); m/z 1339 ([M-PF₆]⁺).

Example C-2-2

<Synthesis of the mononuclear ruthenium complex (C-M-2b) [[(BiBzImH)Ru(5,6-dmphen)₂](PF₆)] (the complex of the formula (3-3) in which $R^1=R^2=R^3=R^6=R^7=R^8$=hydrogen atom, and $R^4=R^5$=methyl group)>

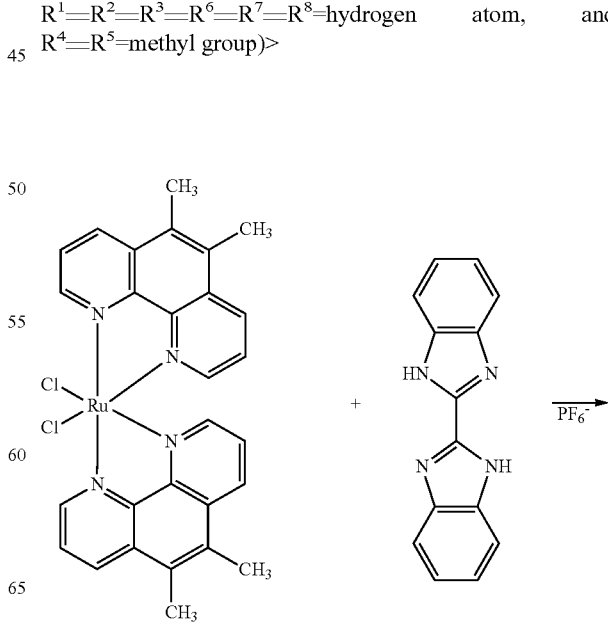

-continued

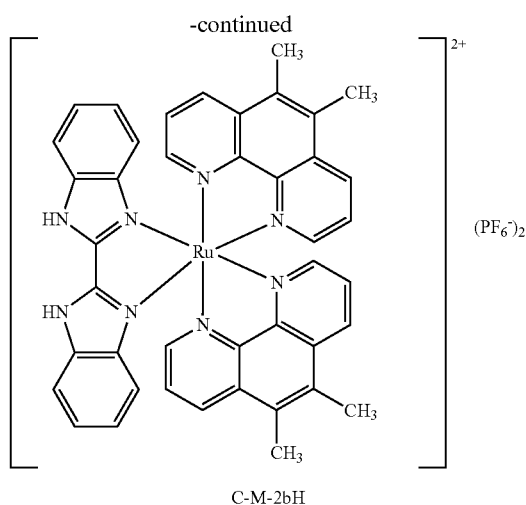

C-M-2bH

Under nitrogen atmosphere, into a 100 mL three-necked flask were placed Ru(5,6-dmphen)₂Cl₂ (0.44 g, 0.73 mmol), BiBzImH₂ (0.21 g, 0.89 mmol) and ethylene glycol (25 mL), and the mixture was refluxed for 5 minutes while being stirred under irradiation with 2.45 GHz microwave. After allowing the reaction liquid to cool down, water (50 mL) and an aqueous solution of ammonium hexafluorophosphate (NH₄PF₆) were added to precipitate a solid. The precipitate was collected by filtration, washed with water and diethyl ether, and then dried under vacuum. The mononuclear ruthenium complex precursor (C-M-2bH) ([(BiBzImH₂)Ru(5,6-dmphen)₂](PF₆)₂) (0.71 g) was obtained.

Then, under nitrogen atmosphere, [(BiBzImH₂)Ru(5,6-dmphen)₂](PF₆)₂ (0.70 g, 0.67 mmol) and methanol (15 mL) were placed into a 50 mL Schlenk flask, and then 28% sodium methoxide methanol solution (1.34 mL) was added dropwise thereto. The resultant suspension was refluxed for 1 hour while being stirred, and then the reaction liquid was cooled to room temperature. The precipitate was collected by filtration, washed with cold methanol and diethyl ether, and then dried under vacuum. The mononuclear ruthenium complex (C-M-2b) (0.49 g) was obtained.

The complex was a novel compound, which had the following properties:

$^1$H-NMR (DMSO-d₆, δ (ppm)); 8.73 (d, 2H), 8.58 (d, 2H), 8.09 (t, 4H), 7.78-7.74 (d, 2H), 7.70-7.66 (dd, 2H), 6.70-6.66 (t, 2H), 6.32-6.28 (t, 2H), 5.10 (d, 2H), 2.79-2.74 (d, 12H).

Example C-2

<Synthesis of the binuclear ruthenium complex dye (C-1b) [[(H₂dcbpy)(Hdcbpy)Ru(BiBzIm)Ru(5,6-dmphen)₂](PF₆)] (the complex of the formula (3-1) in which $R^1=R^2=R^3=R^6=R^7=R^8$=hydrogen atom, and $R^4=R^5$=methyl group)>

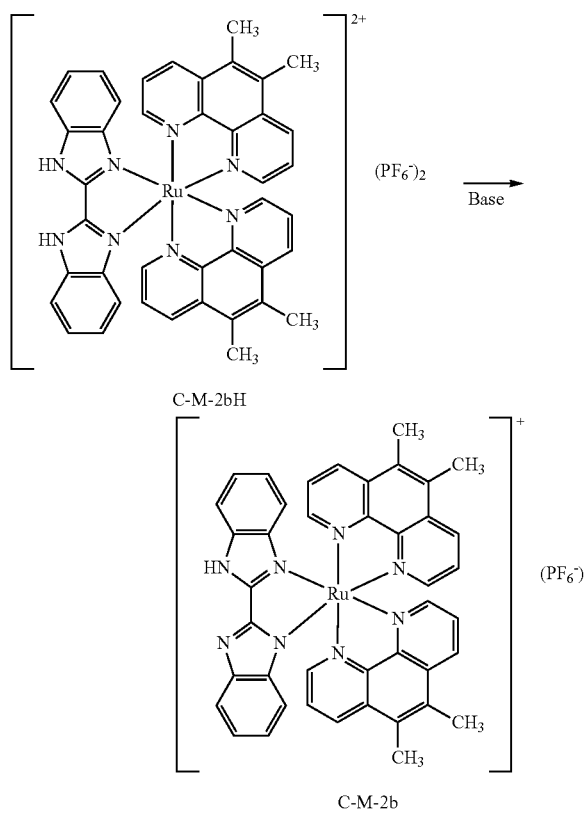

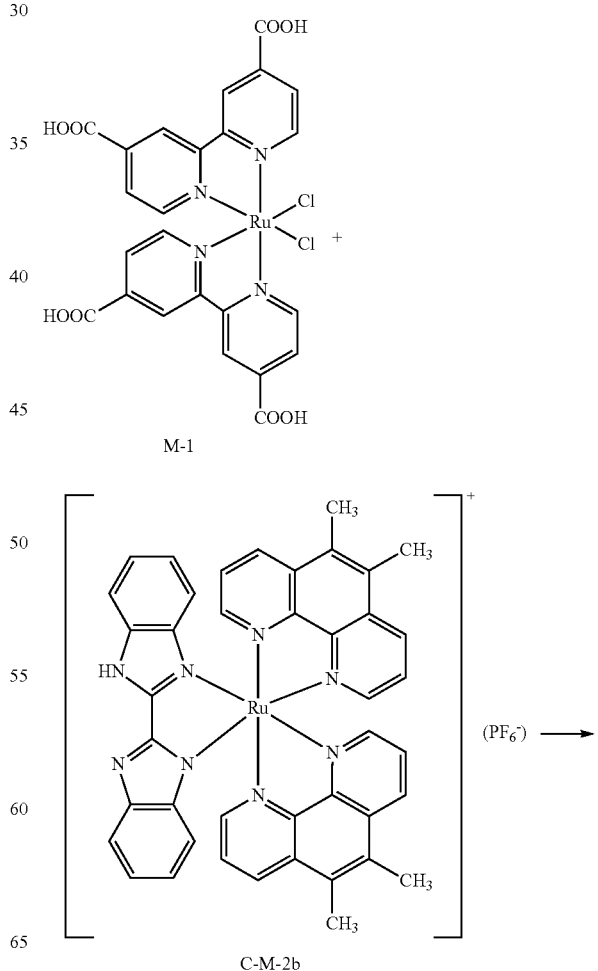

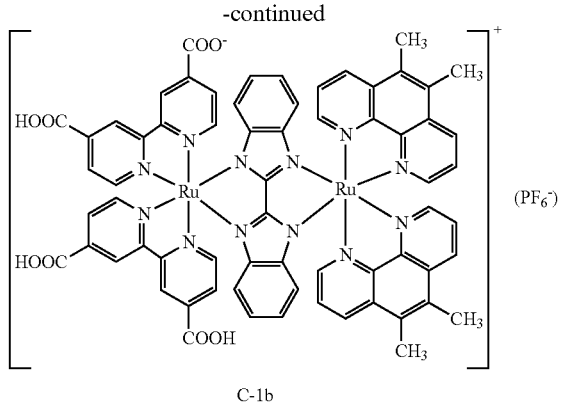

C-1b

Under nitrogen atmosphere, into a 200 mL three-necked flask were placed the mononuclear ruthenium complex (M-1) (0.19 g, 0.27 mmol) and water (20 mL), and then 1 mol/l aqueous sodium hydroxide solution (1 mL) was added dropwise thereto and dissolved therein. And then, N,N-dimethylformamide (80 mL) and the mononuclear ruthenium complex (C-M-2b) (0.20 g, 0.22 mmol) were added to the resultant solution. The mixture was refluxed for 30 minutes while being stirred under irradiation with 2.45 GHz microwave. After cooling down, the reaction liquid was filtrated, and the resultant filtrate was concentrated under reduced pressure. And then, water (60 mL) was added to the resultant concentrate and dissolved therein. And then, the solution was filtrated, and 0.5 mol/l hexafluorophosphoric acid aqueous solution was added dropwise to the filtrate until pH became 2.8. After the resultant mixture was cooled at 4° C. overnight, the precipitate was collected by filtration, washed with hexafluorophosphoric acid aqueous solution at pH 2.8, acetone/diethyl ether (1:4) and diethyl ether, and then dried under vacuum. The binuclear ruthenium complex dye (C-1b) (0.32 g) was obtained.

The complex was a novel compound, which had the following properties:

$^1$H-NMR (DMSO-$d_6$, δ (ppm)); 9.06 (brs, 3H), 8.85-8.75 (m, 5H), 8.63 (d, 1H), 8.30 (d, 1H), 8.21 (d, 1H), 8.08-8.02 (m, 2H), 7.75-7.69 (m, 8H), 6.69 (dd, 2H), 6.51 (dd, 2H), 5.57-5.52 (t, 2H), 5.29 (d, 1H), 5.22 (d, 1H), 2.82-2.73 (m, 12H).

Mass spectrometry (ESI-MS, solvent: methanol); m/z 1339 ([M-PF$_6$]$^+$).

Example C-3-2

<Synthesis of the mononuclear ruthenium complex (C-M-3a) [[(BiBzIm)Ru(3,4,7,8-tmphen)$_2$]] (the complex of the formula (3-4) in which $R^1$=$R^4$=$R^5$=$R^8$=hydrogen atom, and $R^2$=$R^3$=$R^6$=$R^7$=methyl group)>

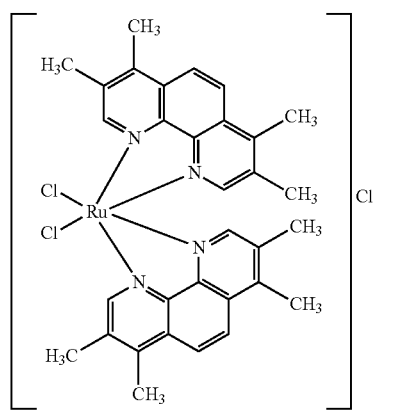

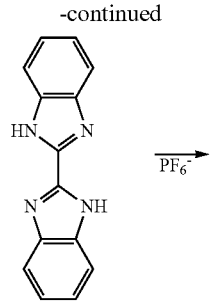

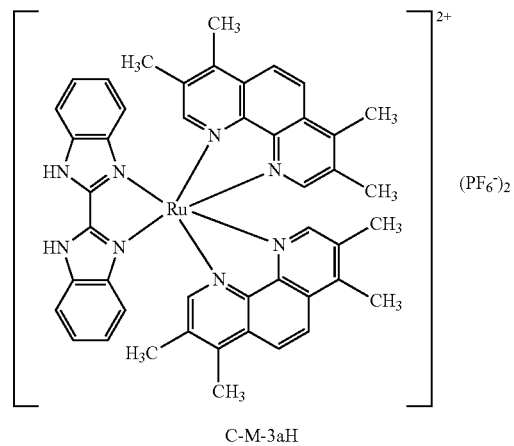

C-M-3aH

Under nitrogen atmosphere, into a 100 mL three-necked flask were placed [Ru(3,4,7,8-tmphen)$_2$Cl$_2$](Cl) (0.47 g, 0.73 mmol), BiBzImH$_2$ (0.21 g, 0.87 mmol) and ethylene glycol (25 mL), and the mixture was refluxed for 5 minutes while being stirred under irradiation with 2.45 GHz microwave. After allowing the reaction liquid to cool down, water (50 mL) and an aqueous solution of ammonium hexafluorophosphate (NH$_4$PF$_6$) were added to precipitate a solid. The precipitate was collected by filtration, washed with water and diethyl ether, and then dried under vacuum. The mononuclear ruthenium complex precursor (C-M-3aH) ([(BiBzImH$_2$)Ru(3,4,7,8-tmphen)$_2$](PF$_6$)$_2$) (0.77 g) was obtained.

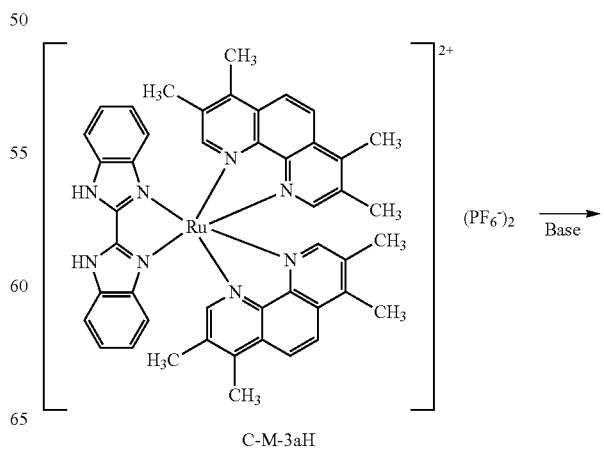

C-M-3aH

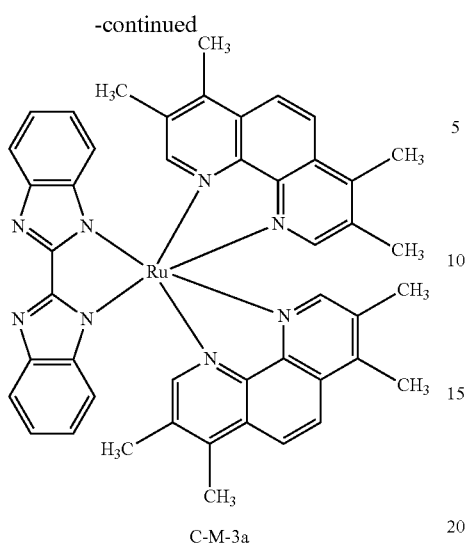

C-M-3a

Then, under nitrogen atmosphere, [(BiBzImH$_2$)Ru(3,4,7,8-tmphen)$_2$](PF$_6$)$_2$ (0.76 g, 0.69 mmol) and methanol (15 mL) were placed into a 50 mL Schlenk flask, and then 28% sodium methoxide methanol solution (1.38 mL) was added dropwise thereto. The resultant suspension was refluxed for 1 hour while being stirred, and then the reaction liquid was cooled to room temperature. The precipitate was collected by filtration, washed with cold methanol and diethyl ether, and then dried under vacuum. The mononuclear ruthenium complex (C-M-3a) (0.41 g) was obtained.

The complex was a novel compound, which had the following properties:

$^1$H-NMR (DMSO-d$_6$, δ (ppm)); 8.35 (m, 4H), 7.95-7.80 (m, 4H), 7.37 (d, 2H), 6.67 (t, 2H), 6.29 (t, 2H), 5.09 (m, 2H), 2.75 (s, 6H), 2.64 (s, 6H), 2.25 (s, 6H), 2.12 (s, 6H).

Example C-3

<Synthesis of the binuclear ruthenium complex dye (C-1d) [[(H$_2$dcbpy)(Hdcbpy)Ru(BiBzIm)Ru(3,4,7,8-tmphen)$_2$](PF$_6$)] (the complex of the formula (3-1) in which R$^1$=R$^4$=R$^5$=R$^8$=hydrogen atom, and R$^2$=R$^3$=R$^6$=R$^7$=methyl group)>

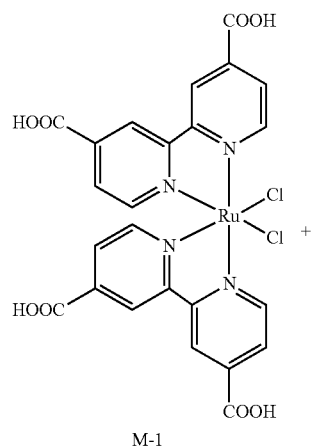

M-1

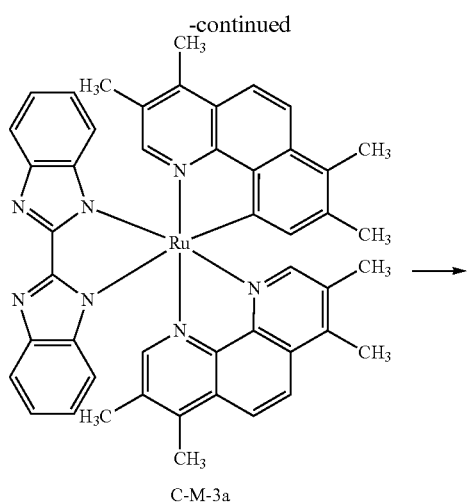

C-M-3a

C-1d

Under nitrogen atmosphere, into a 500 mL three-necked flask were placed the mononuclear ruthenium complex (M-1) (0.35 g, 0.50 mmol) and water (40 mL), and then 1 mol/l aqueous sodium hydroxide solution (1.94 mL) was added dropwise thereto and dissolved therein. And then, N,N-dimethylformamide (160 mL) and the mononuclear ruthenium complex (C-M-3a) (0.40 g, 0.50 mmol) were added to the resultant solution. The mixture was refluxed for 30 minutes while being stirred under irradiation with 2.45 GHz microwave. After cooling down, the reaction liquid was filtrated, and the resultant filtrate was concentrated under reduced pressure. And then, water (52 mL) was added to the resultant concentrate and dissolved therein. And then, the solution was filtrated, and 0.5 mol/l hexafluorophosphoric acid aqueous solution was added dropwise to the filtrate until pH became 3.0. After the resultant mixture was cooled at 4° C. overnight, the precipitate was collected by filtration, washed with hexafluorophosphoric acid aqueous solution at pH 3.0, acetone/diethyl ether (1:4) and diethyl ether, and then dried under vacuum. The binuclear ruthenium complex dye (C-1d) (0.16 g) was obtained.

The complex was a novel compound, which had the following properties:

$^1$H-NMR (DMSO-d$_6$, δ (ppm)); 9.15 (brs, 4H), 8.42-7.75 (m, 16H), 6.56 (t, 2H), 6.44 (t, 2H), 5.50 (t, 2H), 5.27-5.11 (m, 2H), 2.82-2.70 (m, 14H), 2.27-2.16 (m, 10H).

Mass spectrometry (ESI-MS, solvent: methanol); m/z 1395 ([M-PF$_6$]$^+$).

Example C-4-2

<Synthesis of the mononuclear ruthenium complex (C-M-4-a) [[(BiBzIm)Ru(4,7-dipphen)$_2$]] (the complex of the formula (3-4) in which $R^1=R^2=R^4=R^5=R^7=R^8$=hydrogen atom, and $R^3=R^6$=phenyl group)>

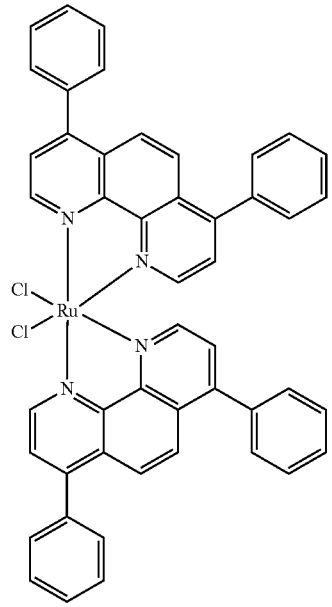

+

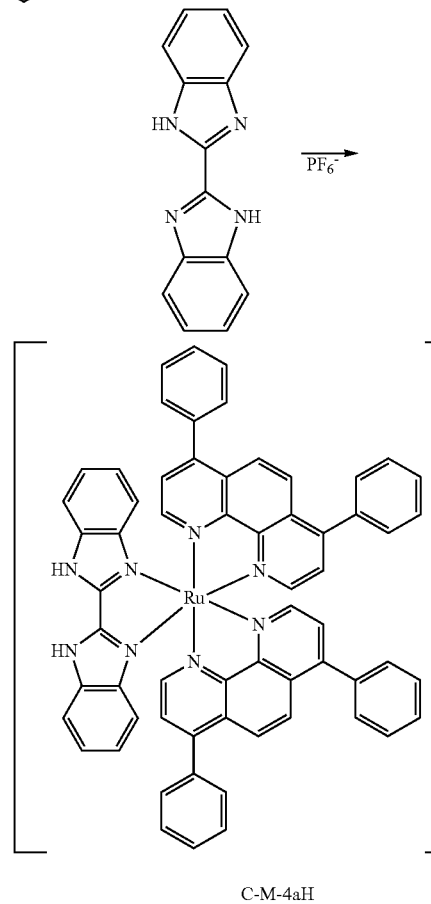

Under nitrogen atmosphere, into a 100 mL three-necked flask were placed Ru(4,7-dipphen)$_2$Cl$_2$ (0.51 g, 0.61 mmol), BiBzImH$_2$ (0.17 g, 0.74 mmol) and ethylene glycol (25 mL), and the mixture was refluxed for 5 minutes while being stirred under irradiation with 2.45 GHz microwave. After allowing the reaction liquid to cool down, water (50 mL) and an aqueous solution of ammonium hexafluorophosphate (NH$_4$PF$_6$) were added to precipitate a solid. The precipitate was collected by filtration, washed with water and diethyl ether, and then dried under vacuum. The mononuclear ruthenium complex precursor (C-M-4-aH) ([(BiBzImH$_2$)Ru(4,7-dipphen)$_2$](Cl)(PF$_6$)) (0.70 g) was obtained.

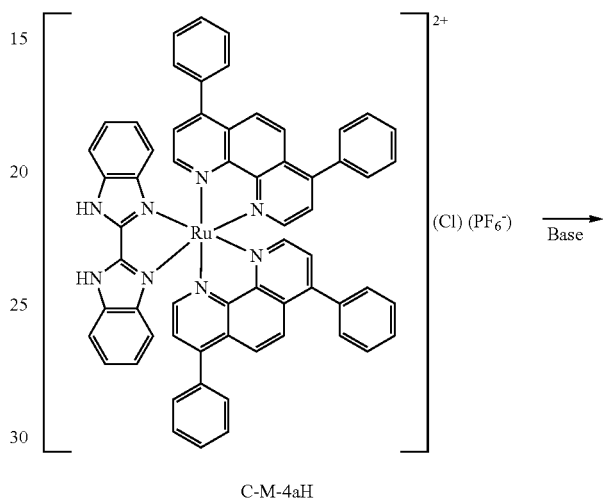

C-M-4aH

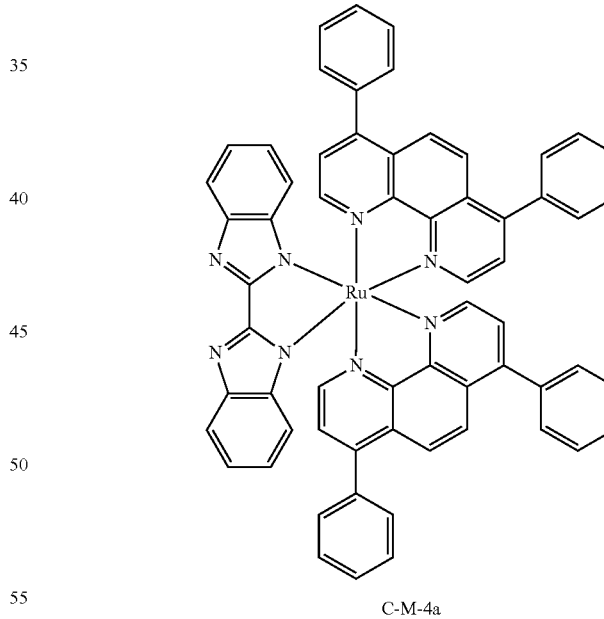

C-M-4a

Then, under nitrogen atmosphere, [(BiBzImH$_2$)Ru(4,7-dipphen)$_2$](Cl)(PF$_6$) (0.69 g, 0.53 mmol) and methanol (15 mL) were placed into a 50 mL Schlenk flask, and then 28% sodium methoxide methanol solution (1.06 mL) was added dropwise thereto. The resultant suspension was refluxed for 1 hour while being stirred, and then the reaction liquid was cooled to room temperature. The precipitate was collected by filtration, washed with cold methanol, and then dried under vacuum. The mononuclear ruthenium complex (C-M-4-a) (0.39 g) was obtained.

The complex was a novel compound, which had the following properties:

$^1$H-NMR (DMSO-$d_6$, δ (ppm)); 8.49 (d, 2H), 8.29 (d, 2H), 8.17 (t, 4H), 7.86 (d, 2H), 7.79 (d, 2H), 7.71-7.52 (m, 20H), 7.42 (d, 2H), 6.72 (t, 2H), 6.40 (t, 2H), 5.27 (d, 2H).

Example C-4

<Synthesis of the binuclear ruthenium complex dye (C-1e) [[(H$_2$dcbpy)(Hdcbpy)Ru(BiBzIm)Ru(4,7-dipphen)$_2$](PF$_6$)] (the complex of the formula (3-1) in which R$^1$=R$^2$=R$^4$=R$^5$=R$^7$=R$^8$=hydrogen atom, and R$^3$=R$^6$=phenyl group)>

Under nitrogen atmosphere, into a 500 mL three-necked flask were placed the mononuclear ruthenium complex (M-1) (0.58 g, 0.83 mmol) and water (80 mL), and then 1 mol/l aqueous sodium hydroxide solution (3.50 mL) was added dropwise thereto and dissolved therein. And then, N,N-dimethylformamide (320 mL) and the mononuclear ruthenium complex (C-M-4-a) (0.83 g, 0.83 mmol) were added to the resultant solution. The mixture was refluxed for 30 minutes while being stirred under irradiation with 2.45 GHz microwave. After cooling down, the reaction liquid was filtrated, and the resultant filtrate was concentrated under reduced pressure. And then, water (220 mL) was added to the resultant concentrate and dissolved therein. And then, the solution was

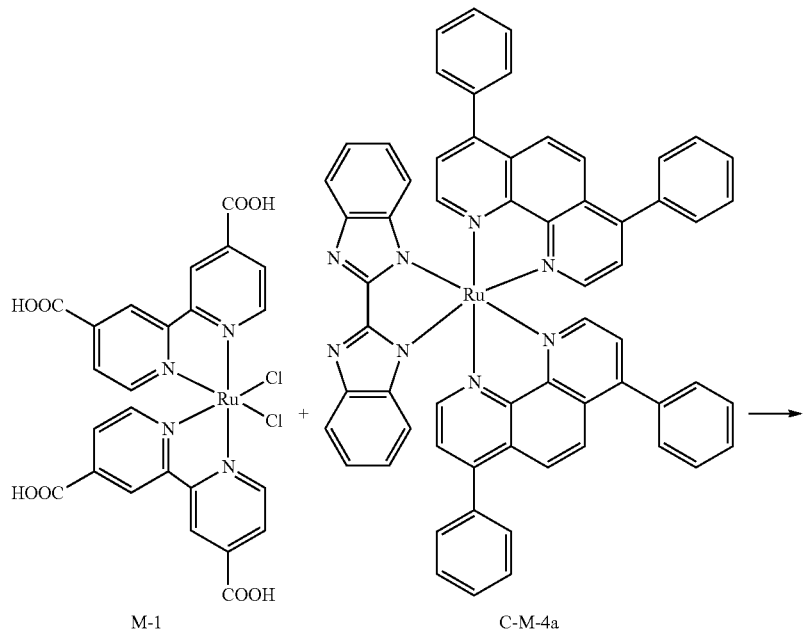

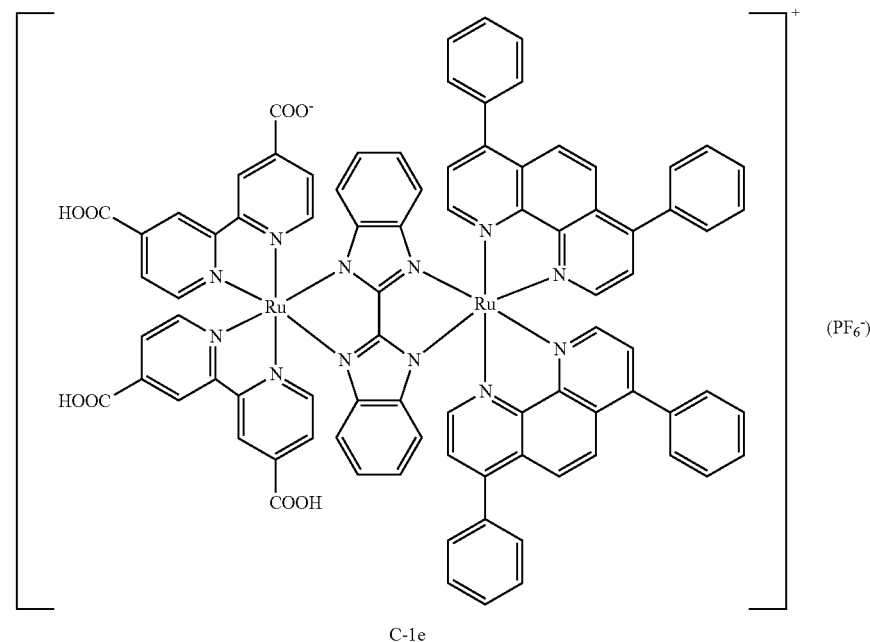

filtrated, and 0.5 mol/l hexafluorophosphoric acid aqueous solution was added dropwise to the filtrate until pH became 3.0. After the resultant mixture was cooled at 4° C. overnight, the precipitate was collected by filtration, washed with hexafluorophosphoric acid aqueous solution at pH 3.0, and then dried under vacuum. The binuclear ruthenium complex dye (C-1e) (0.27 g) was obtained.

The complex was a novel compound, which had the following properties:

$^1$H-NMR (DMSO-$d_6$, δ (ppm)); 9.16 (brs, 4H), 8.25-7.61 (m, 40H), 6.76-6.58 (m, 4H), 5.60-5.28 (m).

Mass spectrometry (ESI-MS, solvent: methanol); m/z 1587 ([M-PF$_6$]$^+$).

Example C-5

Production of a Photochemical Cell

Using the binuclear ruthenium complex dye (C-1a) obtained in Example C-1, the binuclear ruthenium complex dye (C-1b) obtained in Example C-2, and a known binuclear ruthenium complex dye (C-1c) [[(H$_2$dcbpy)(Hdcbpy)Ru(BiBzIm)Ru(phen)$_2$](PF$_6$)] (the complex of the formula (3-1) in which $R^1$ to $R^8$=H), which is represented by the formula described below, photochemical cells were produced in the same way as in Example A-3, except that the concentration of the binuclear ruthenium complex dye solution used for dye adsorption was 0.02 mmol/l or 0.05 mmol/l.

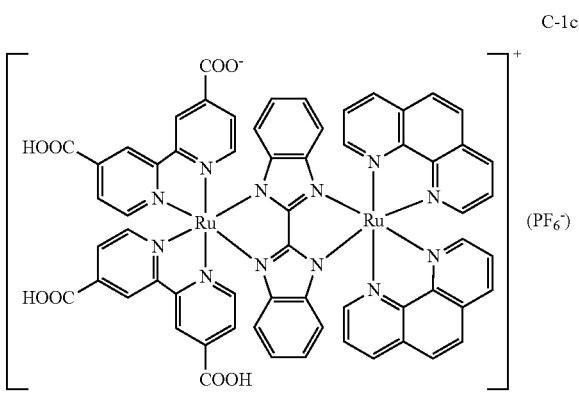

C-1c

<Measurement of Conversion Efficiency>

The photoelectric conversion efficiency of the photochemical cell obtained was measured in the same way as in Example A-3.

The binuclear ruthenium complex dyes (C-1a) and (C-1b) of the present invention, and the known binuclear ruthenium complex dye (C-1c) had a photoelectric conversion efficiency on a per-ruthenium-complex-dye basis of 46.7×10$^7$%/mol, 31.3×10$^7$%/mol and 27.3×10$^7$%/mol, respectively. The results indicate that higher photoelectric conversion efficiency on a per-ruthenium-complex-dye basis may be achieved by the introduction of a hydrophobic substituent, particularly preferably methyl group, into the binuclear ruthenium complex dye; and the binuclear ruthenium complex dye of the present invention, which has a hydrophobic substituent, may be promising for producing a high-performance photochemical cell.

Example D-1-2

<Synthesis of the mononuclear osmium complex (D-M-2) [[(BiBzIm)Os(4,4'-dmbpy)$_2$]] (the complex of the formula (4-3) in which $R^{04}$=methyl group)>

Under nitrogen atmosphere, into a 100 mL three-necked flask were placed Os(4,4'-dmbpy)$_2$Cl$_2$ (0.504 g, 0.800 mmol), 2,2'-bibenzimidazole (BiBzImH$_2$) (0.225 g, 0.960 mmol) and ethylene glycol (21 mL), and the mixture was refluxed for 5 minutes under irradiation with 2.45 GHz microwave. After cooling down, water (21 mL) was added to the reaction liquid to precipitate unreacted bibenzimidazole, which was filtrated off. An aqueous solution of ammonium hexafluorophosphate (NH$_4$PF$_6$) was added to the resultant filtrate to precipitate a solid. The precipitate was collected by filtration, washed with water and diethyl ether, and then dried under vacuum. The complex (0.710 g) was obtained.

Subsequently, the obtained complex was completely dissolved in the mixed solvent of methanol (40 mL) and acetone (20 mL), and then an aqueous solution of hydrosulphite sodium (Na$_2$S$_2$O$_4$) and an aqueous solution of ammonium hexafluorophosphate (NH$_4$PF$_6$) were added. And then, the mixture was stirred to precipitate a solid. The precipitate was collected by filtration, washed with water, and then dried under vacuum. The mononuclear osmium complex precursor (D-M-2H) ([(BiBzImH$_2$)Os(4,4'-dmbpy)$_2$](PF$_6$)$_2$) (0.570 g) was obtained.

Then, under nitrogen atmosphere, [(BiBzImH$_2$)Os(4,4'-dmbpy)$_2$](PF$_6$)$_2$ (0.556 g, 0.513 mmol) and methanol (15 mL) were placed into a 100 mL recovery flask, and then 28% sodium methoxide methanol solution (0.991 mL, 5.13 mmol) was added dropwise thereto. The resultant suspension was refluxed for 2 hours while being stirred, and then the reaction liquid was cooled to room temperature. The precipitate was collected by filtration, washed with 1.73% sodium methoxide methanol solution, and then dried under vacuum. The mononuclear osmium complex (D-M-2) (0.373 g) was obtained.

Example D-1

<Synthesis of the ruthenium-osmium complex dye (D-1) [[(H$_2$dcbpy)$_2$Ru(BiBzIm)Os(4,4'-dmbpy)$_2$](PF$_6$)$_2$] (the complex of the formula (4-1) in which $R^{04}$=methyl group)>

Under nitrogen atmosphere, into a 200 mL three-necked flask were placed the mononuclear ruthenium complex (M-1) (0.222 g, 0.318 mmol) and water (30 mL), and then 1 mol/l aqueous sodium hydroxide solution (1.25 mL) was added dropwise thereto and dissolved therein. And then, the mononuclear osmium complex (D-M-2) (0.302 g, 0.382 mmol) and ethanol (30 mL) were added to the resultant solution. The mixture was refluxed for 40 minutes while being stirred under irradiation with 2.45 GHz microwave. After cooling down, the reaction liquid was filtrated, and then ethanol in the filtrate was distilled off under reduced pressure. The resultant concentrate was filtrated, and an insoluble substance was filtrated off. And then, hexafluorophosphoric acid aqueous solution was added dropwise to the filtrate until pH became 2.3. After the resultant mixture was cooled at 4° C. overnight, the precipitate was collected by filtration, washed with hexafluorophosphoric acid aqueous solution at pH 2.3, acetone/diethyl ether (1:4) and diethyl ether, and then dried under vacuum. The ruthenium-osmium complex dye (D-1) (0.184 g) was obtained.

Example D-2

Production of a Photochemical Cell

Using the ruthenium-osmium complex dye (D-1) obtained in Example D-1, a photochemical cell was produced in the same way as in Example A-3.

Example D-3-1

Measurement of HOMO Level of Dye

The ionization potentials (Ip) of the ruthenium-osmium complex dye (D-1) obtained in Example D-1, and a known ruthenium-osmium complex dye (D-2) [[(H$_2$dcbpy)(Hdcbpy)Ru(BiBzIm)Os(bpy)$_2$](PF$_6$)] (the complex of the formula (4-1) in which R$^{04}$=H) were measured using an atmospheric photoelectron spectrometer AC-3 made by Riken Keiki Co., Ltd. and assumed as HOMO (eV).

Example D-3-2

Calculation of HOMO-LUMO Gap ΔE of Dye

Using the ruthenium-osmium complex dye (D-1) obtained in Example D-1, and the known ruthenium-osmium complex dye (D-2) [[(H$_2$dcbpy)(Hdcbpy)Ru(BiBzIm)Os(bpy)$_2$] (PF$_6$)] (the complex of the formula (4-1) in which R$^{04}$=H), two different types of 3×10$^{-5}$ mol/l solutions of dye in ethanol were prepared, and ultraviolet-visible absorption spectra of the solutions were measured. The HOMO-LUMO gap ΔE (eV) was calculated from the following formula in which the absorption edge λ (nm) is assumed to be a wavelength at which the absorbance equals the value of the formula: (1-0.9)×A (wherein A represents the absorbance at the maximum absorption wavelength on the longest side).

$$\Delta E(eV) = 1240/\lambda(nm)$$

Example D-3-3

Calculation of LUMO Level of Dye

The LUMO (eV) was calculated from the following formula based on the results of Example D-3-1 and Example D-3-2.

$$LUMO(eV) = HOMO(eV) + \Delta E(eV)$$

Figure 3:
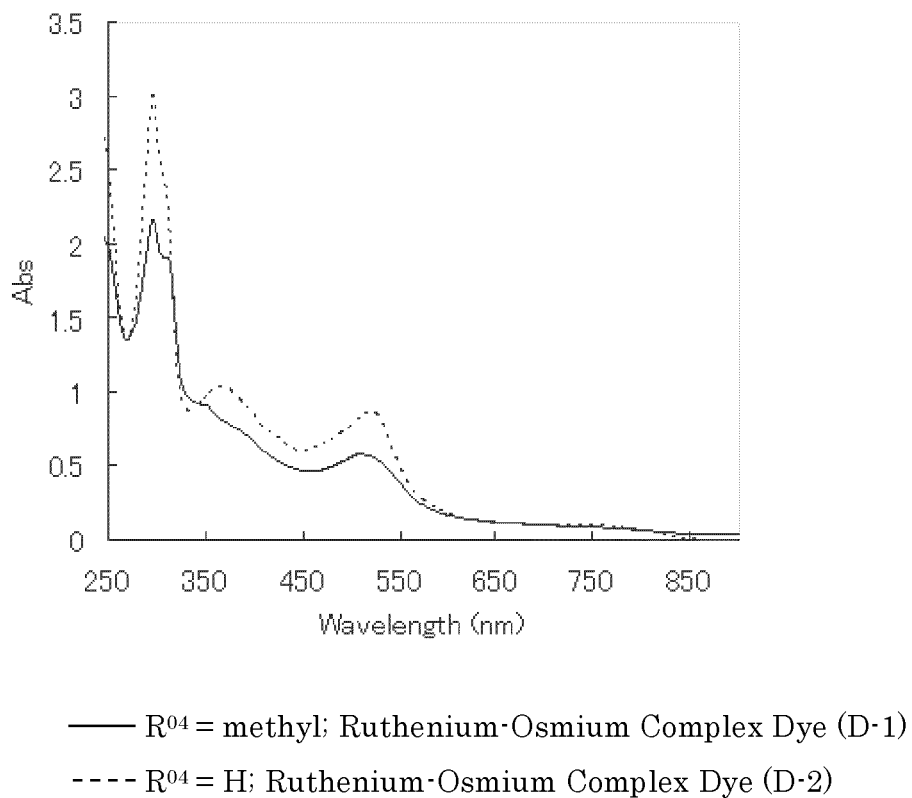
FIG. 3 is ultraviolet-visible absorption spectra of the binuclear ruthenium-osmium complex dye (D-1) and a known binuclear ruthenium-osmium complex dye (D-2).
Figure 4:
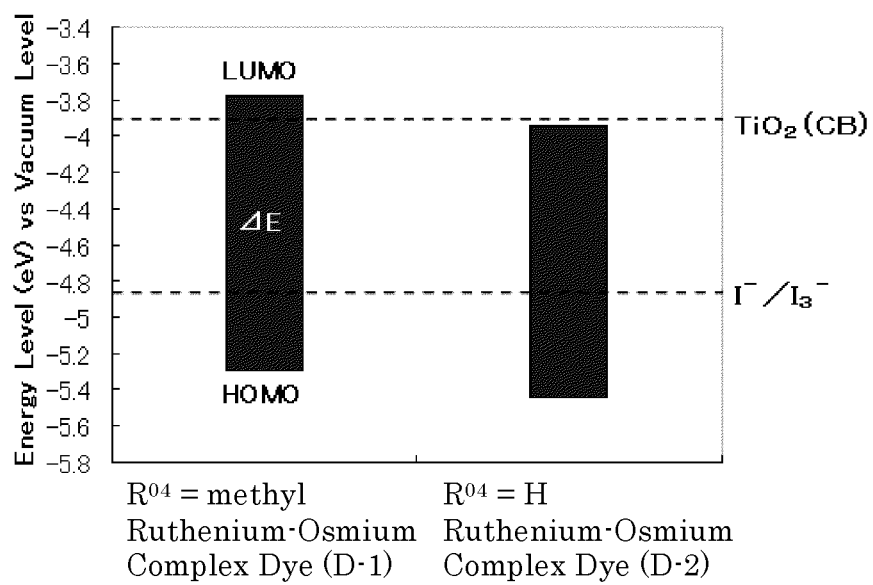
FIG. 4 illustrates HOMO-LUMO energy levels of the binuclear ruthenium-osmium complex dye (D-1) and a known binuclear ruthenium-osmium complex dye (D-2).

FIG. 3 shows ultraviolet-visible absorption spectra of the binuclear ruthenium-osmium complex dye (D-1) and the known binuclear ruthenium-osmium complex dye (D-2). FIG. 4 shows HOMO-LUMO energy levels of the binuclear ruthenium-osmium complex dye (D-1) and the known binuclear ruthenium-osmium complex dye (D-2), together with energy levels of TiO$_2$ (CB) and iodine redox (I$^-$/I$_3^-$).

As seen from the results given in FIGS. 3 and 4, the known ruthenium-osmium complex dye (D-2) has LUMO level mismatching the energy level of TiO$_2$ (CB), while the ruthenium-osmium complex dye (D-1) of the present invention maintains the ability to absorb light of longer wavelength and has the suitable HOMO-LUMO energy level wherein the energy levels of TiO$_2$ (CB) and iodine redox (I$^-$/I$_3^-$) are located between HOMO level and LUMO level of the ruthenium-osmium complex dye (D-1). It is expected that the use of the ruthenium-osmium complex dye (D-1) enables efficient electron transfer, thereby improving photoelectric conversion efficiency.

INDUSTRIAL APPLICABILITY

According to the first invention, there may be provided a binuclear ruthenium complex dye for realizing a photoelectric conversion element and a photochemical cell which may exhibit high photoelectric conversion efficiency, and be produced by adsorbing the binuclear ruthenium complex dye to a semiconductor particle in a shorter period of time.

According to the second invention, there may be provided a binuclear ruthenium complex dye, which is capable of absorbing light over a wider wavelength range, for realizing a photoelectric conversion element and a photochemical cell which may convert solar light into electricity over a wide wavelength range, and exhibit high photoelectric conversion efficiency.

According to the third invention, there may be provided a binuclear ruthenium complex dye containing 1,10-phenanthroline having a hydrophobic substituent as a ligand, and a photoelectric conversion element and a photochemical cell comprising the complex dye; particularly preferably a binuclear ruthenium complex dye for realizing a photoelectric conversion element and a photochemical cell which may exhibit high photoelectric conversion efficiency on a per-ruthenium-complex-dye basis even when using an aqueous liquid electrolyte.

According to the fourth invention, there may be provided a ruthenium-osmium complex dye, which is capable of absorbing light of longer wavelength and has HOMO-LUMO level matching the energy levels of TiO$_2$ (CB) and iodine redox (I$^-$/I$_3^-$). It is expected that the ruthenium-osmium complex dye provides improvements in photoelectric conversion efficiency in view of efficient electron transfer.

The invention claimed is:

1. A photoelectric conversion element comprising a binuclear ruthenium complex dye and a semiconductor particle; wherein the binuclear ruthenium complex dye is represented by the following general formula (1-1):

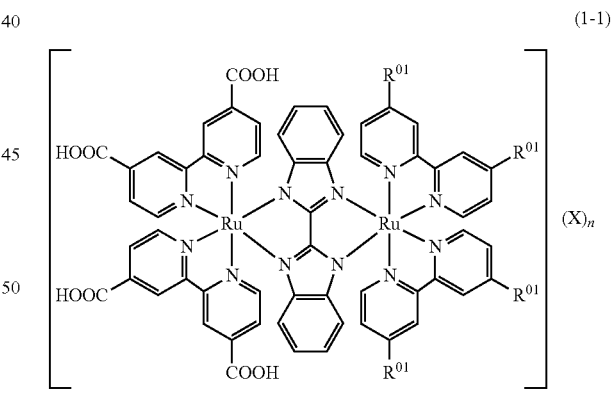

(1-1)

wherein R$^{01}$ represents a linear or branched alkyl group having 4 to 9 carbon atoms; X represents a counter ion; and n represents a number of the counter ions needed to neutralize a charge of the complex and in which proton(s) (H$^+$) of one or more carboxyl groups (—COOH) may dissociate.

2. A photoelectric conversion element according to claim 1, wherein the semiconductor particle is at least one selected from the group consisting of titanium oxide, zinc oxide and tin oxide.

3. A photochemical cell comprising a photoelectric conversion element according to claim 1.

4. A photochemical cell comprising
a photoelectric conversion element according to claim 1,
a counter electrode, and
an electrolyte layer between the counter electrode and the photoelectric conversion element.

5. A process for producing a photoelectric conversion element, comprising a step of:
immersing a semiconductor particle in a solution containing a binuclear ruthenium complex dye according to claim 1.

6. A process for producing a photoelectric conversion element, comprising steps of:
forming a semiconductor layer comprising a semiconductor particle on a conductive support; and
immersing the semiconductor layer in a solution containing a binuclear ruthenium complex dye according to claim 1.

* * * * *

UNITED STATES PATENT AND TRADEMARK OFFICE
CERTIFICATE OF CORRECTION

PATENT NO. : 8,859,894 B2
APPLICATION NO. : 13/000313
DATED : October 14, 2014
INVENTOR(S) : Kazuaki Kakita et al.

It is certified that error appears in the above-identified patent and that said Letters Patent is hereby corrected as shown below:

IN THE SPECIFICATION

In column 32 at line 31, Change "$R^{01}$=H))," to --$R^{01}$=H)),--.

In column 32 at line 47, Change "(1:0]" to --(1:1)]--.

In column 37 at line 30 (approx.), Change "$R^{02}$=H)." to --$R^{02}$=H).--.

In column 39 at line 6 (approx.), Change "$R^1=R^2=R^4=R^5=R^7=R^8$" to --$R^1=R^2=R^4=R^5=R^7=R^8$--.

In column 39 at line 7 (approx.), Change "$R^3=R^6$" to --$R^3=R^6$--.

In column 41 at line 7, Change "$R^1=R^2=R^4=R^5=R^7=R^8$" to --$R^1=R^2=R^4=R^5=R^7=R^8$--.

In column 42 at line 44, Change "$R^1=R^2=R^3=R^6=R^7=R^8$" to --$R^1=R^2=R^3=R^6=R^7=R^8$--.

In column 42 at line 45, Change "$R^4=R^5$" to --$R^4=R^5$--.

In column 44 at line 25 (approx.), Change "$R^1=R^2=R^3=R^6=R^7=R^8$" to --$R^1=R^2=R^3=R^6=R^7=R^8$--.

In column 45 at line 49, Change "$R^1=R^4=R^5=R^8$" to --$R^1=R^4=R^5=R^8$--.

In column 45 at line 50, Change "$R^2=R^3=R^6=R^7$" to --$R^2=R^3=R^6=R^7$--.

In column 47 at line 46, Change "$R^1=R^4=R^5=R^8$" to --$R^1=R^4=R^5=R^8$--.

In column 47 at line 47, Change "$R^2=R^3=R^6=R^7$" to --$R^2=R^3=R^6=R^7$--.

In column 49 at lines 3-4, Change "(C-M-4-a)" to --(C-M-4a)--.

In column 49 at line 5, Change "$R^1=R^2=R^4=R^5=R^7=R^8$" to --$R^1=R^2=R^4=R^5=R^7=R^8$--.

In column 49 at line 6, Change "$R^3=R^6$" to --$R^3=R^6$--.

In column 50 at line 11, Change "(C-M-4-aH)" to --(C-M-4aH)--.

In column 50 at line 66, Change "(C-M-4-a)" to --(C-M-4a)--.

In column 51 at line 12, Change "$R^1=R^2=R^4=R^5=R^7=R^8$" to --$R^1=R^2=R^4=R^5=R^7=R^8$--.

In column 51 at line 13, Change "$R^3=R^6$" to --$R^3=R^6$--.

In column 52 at line 7, Change "(C-M-4-a)" to --(C-M-4a)--.

Signed and Sealed this
Fifth Day of July, 2016

Michelle K. Lee
*Director of the United States Patent and Trademark Office*

CERTIFICATE OF CORRECTION (continued)
U.S. Pat. No. 8,859,894 B2

IN THE SPECIFICATION

In column 53 at line 27, Change "$R^8$=H)," to --$R^8$=H),--.

In column 55 at line 17, Change "$R^{04}$=H)" to --$R^{04}$=H)--.

In column 55 at line 28, Change "$R^{04}$=H)," to --$R^{04}$=H),--.